US012074390B2

(12) United States Patent
DuBose et al.

(10) Patent No.: US 12,074,390 B2
(45) Date of Patent: Aug. 27, 2024

(54) PARALLEL RESONANCE ANTENNA FOR RADIAL PLASMA CONTROL

(71) Applicant: Tokyo Electron Limited, Tokyo (JP)

(72) Inventors: Chelsea DuBose, Austin, TX (US); Barton Lane, Austin, TX (US); Merritt Funk, Austin, TX (US); Justin Moses, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 104 days.

(21) Appl. No.: 17/985,360

(22) Filed: Nov. 11, 2022

(65) Prior Publication Data

US 2024/0162619 A1    May 16, 2024

(51) Int. Cl.
*H01Q 9/27* (2006.01)
*H01Q 5/25* (2015.01)

(52) U.S. Cl.
CPC ............... *H01Q 9/27* (2013.01); *H01Q 5/25* (2015.01)

(58) Field of Classification Search
CPC ................................ H01Q 9/27; H01Q 5/25
See application file for complete search history.

(56) References Cited

U.S. PATENT DOCUMENTS

| 4,948,458 A | 8/1990 | Ogle |
| 5,540,800 A | 7/1996 | Qian |
| 5,731,565 A | 3/1998 | Gates |
| 5,759,280 A | 6/1998 | Holland et al. |
| 5,777,289 A | 7/1998 | Hanawa et al. |
| 5,783,101 A | 7/1998 | Ma et al. |
| 5,800,619 A | 9/1998 | Holland et al. |
| 5,874,704 A | 2/1999 | Gates |
| 5,897,712 A | 4/1999 | Hanawa et al. |
| 5,907,221 A | 5/1999 | Sato et al. |

(Continued)

FOREIGN PATENT DOCUMENTS

| EP | 2936615 B1 * | 8/2018 | ............... H01Q 1/38 |
| JP | 3205542 B2 | 9/2001 | |
| KR | 20170022902 A | 3/2017 | |

OTHER PUBLICATIONS

U.S. Appl. No. 17/675,228, filed Feb. 18, 2022, entitled "Antenna For Inductively Coupled Plasma Excitation, Antenna Unit For Inductively Coupled Plasma Excitation, and Plasma Processing Apparatus," 58 pages.

(Continued)

*Primary Examiner* — Seung H Lee

(74) *Attorney, Agent, or Firm* — Slater Matsil, LLP

(57) ABSTRACT

According to an embodiment, a radiating structure of a resonating structure used for plasma processing is disclosed. The radiating structure includes a set of first arms and a set of second arms. Each first arm has a first inductance and is coupled to a respective first capacitor and a respective second capacitor of the resonating structure to form a corresponding first resonant circuit operating at a first resonance frequency. Each second arm has a second inductance and is coupled to a respective third capacitor and a respective fourth capacitor of the resonating structure to form a corresponding second resonant circuit operating at a second resonance frequency. In a first mode of operation, the resonating structure operates as a single resonance antenna. In a second mode of operation, the resonating structure operates as a parallel resonance antenna.

22 Claims, 11 Drawing Sheets

(56) References Cited

U.S. PATENT DOCUMENTS

| | | |
|---|---|---|
| 5,919,382 A | 7/1999 | Qian et al. |
| 5,944,902 A | 8/1999 | Redeker et al. |
| 5,975,013 A | 11/1999 | Holland et al. |
| 6,016,131 A | 1/2000 | Sato et al. |
| 6,027,603 A | 2/2000 | Holland et al. |
| 6,028,395 A | 2/2000 | Holland et al. |
| 6,036,878 A | 3/2000 | Collins |
| 6,054,013 A | 4/2000 | Collins et al. |
| 6,077,384 A | 6/2000 | Collins et al. |
| 6,155,203 A | 12/2000 | Kennedy et al. |
| 6,164,241 A | 12/2000 | Chen et al. |
| 6,165,311 A | 12/2000 | Collins et al. |
| 6,174,450 B1 | 1/2001 | Patrick et al. |
| 6,184,488 B1 | 2/2001 | Gates |
| 6,229,264 B1 | 5/2001 | Ni et al. |
| 6,248,250 B1 | 6/2001 | Hanawa et al. |
| 6,268,700 B1 | 7/2001 | Holland et al. |
| 6,280,563 B1 | 8/2001 | Baldwin, Jr. et al. |
| 6,297,468 B1 | 10/2001 | Qian et al. |
| 6,320,320 B1 | 11/2001 | Bailey, III et al. |
| 6,361,644 B1 | 3/2002 | Collins |
| 6,365,063 B2 | 4/2002 | Collins et al. |
| 6,369,348 B2 | 4/2002 | Qian et al. |
| 6,369,349 B2 | 4/2002 | Qian et al. |
| 6,373,022 B2 | 4/2002 | Qian et al. |
| 6,401,652 B1 | 6/2002 | Mohn et al. |
| 6,409,933 B1 | 6/2002 | Holland et al. |
| 6,414,648 B1 | 7/2002 | Holland et al. |
| 6,441,555 B1 | 8/2002 | Howald et al. |
| 6,444,084 B1 | 9/2002 | Collins |
| 6,444,085 B1 | 9/2002 | Collins et al. |
| 6,462,481 B1 | 10/2002 | Holland et al. |
| 6,463,875 B1 | 10/2002 | Chen et al. |
| 6,504,126 B2 | 1/2003 | Qian et al. |
| 6,507,155 B1 | 1/2003 | Barnes et al. |
| 6,518,705 B2 | 2/2003 | Wilcoxson et al. |
| 6,524,432 B1 | 2/2003 | Collins et al. |
| 6,531,029 B1 | 3/2003 | Ni et al. |
| 6,572,732 B2 | 6/2003 | Collins |
| 6,617,794 B2 | 9/2003 | Barnes et al. |
| 6,623,596 B1 | 9/2003 | Collins et al. |
| 6,646,385 B2 | 11/2003 | Howald et al. |
| 6,653,791 B1 | 11/2003 | Bailey, III et al. |
| 6,653,988 B2 | 11/2003 | Kwon et al. |
| 6,685,798 B1 | 2/2004 | Holland et al. |
| 6,694,915 B1 | 2/2004 | Holland et al. |
| 6,744,213 B2 | 6/2004 | Wilcoxson et al. |
| 6,842,147 B2 | 1/2005 | Howald et al. |
| 6,873,112 B2 | 3/2005 | Wilcoxson et al. |
| 6,893,533 B2 | 5/2005 | Holland et al. |
| 6,897,156 B2 | 5/2005 | Ni et al. |
| 7,096,819 B2 | 8/2006 | Chen et al. |
| 9,313,872 B2 | 4/2016 | Yamazawa et al. |
| 9,767,996 B2 | 9/2017 | O'Neill et al. |
| 10,354,838 B1 | 7/2019 | Mopidevi et al. |
| 10,861,679 B2 * | 12/2020 | Lane ............... H01J 37/32623 |
| 11,056,789 B2 * | 7/2021 | Wu ........................ H01Q 5/10 |
| 11,588,225 B2 * | 2/2023 | Rossman ................ H01Q 7/00 |
| 11,799,205 B1 * | 10/2023 | Byers .................... H01Q 9/065 |
| 2002/0189763 A1 | 12/2002 | Kwon et al. |
| 2012/0223060 A1 | 9/2012 | Yamazawa |
| 2016/0099130 A1 | 4/2016 | Ando et al. |
| 2016/0203951 A1 | 7/2016 | Yamazawa et al. |
| 2023/0054430 A1 * | 2/2023 | Lane ................ H01J 37/32165 |

OTHER PUBLICATIONS

Wei, Wen Yue, et al., "Wideband composite planar spiral antenna for generation of tunable angular momentum wave," vol. 29, No. 3; Feb. 1, 2021, Optics Express, 10 pages.

International Search Report and Written Opinion, PCT Application No. PCT/US2023/030344, mailed Dec. 5, 2023, 10 pages.

* cited by examiner

PARALLEL RESONANCE ANTENNA FOR RADIAL PLASMA CONTROL

TECHNICAL FIELD

The present disclosure generally relates to semiconductor processing technology and, in particular embodiments, to an apparatus for radiating electromagnetic waves in a plasma processing system.

BACKGROUND

Plasma processing is extensively used in the manufacturing and fabrication of high-density microscopic circuits within the semiconductor industry.

In a plasma processing system, an electromagnetic wave radiated into a plasma chamber generates an electromagnetic field. The generated electromagnetic field heats electrons in the chamber. The heated electrons ignite plasma that treats the substrate in a process such as etching, deposit, oxidation, sputtering, or the like.

A non-uniform electromagnetic field within the plasma processing chamber results in a non-uniform treatment of the substrate due to different portions of the substrate being treated with varying densities of plasma. An apparatus and system that improves uniformity and radial distribution (i.e., center-to-edge or edge-to-center) control of the electromagnetic field in a plasma processing system are, thus, desirable.

SUMMARY

Technical advantages are generally achieved by embodiments of this disclosure which describe an apparatus for radiating electromagnetic waves in a plasma processing system.

A first aspect relates to a radiating structure of a resonating structure used for plasma processing. The radiating structure includes a set of first arms and a set of second arms. Each first arm has a first inductance and is coupled to a respective first capacitor and a respective second capacitor of the resonating structure to form a corresponding first resonant circuit operating at a first resonance frequency. Each second arm has a second inductance and is coupled to a respective third capacitor and a respective fourth capacitor of the resonating structure to form a corresponding second resonant circuit operating at a second resonance frequency. In a first mode of operation, the resonating structure operates as a single resonance antenna. In a second mode of operation, the resonating structure operates as a parallel resonance antenna.

In a first implementation form of the radiating structure according to the first aspect as such, each first arm has a same first length, and each second arm has a same second length different than the first length.

In a second implementation form of the radiating structure according to the first aspect as such or any preceding implementation form of the first aspect, each first and each second arm is a spiral.

In a third implementation form of the radiating structure according to the first aspect as such or any preceding implementation form of the first aspect, each first and each second arm is an Archimedean, logarithmic, Fibonacci, involute of circle, or straight-line spiral.

In a fourth implementation form of the radiating structure according to the first aspect as such or any preceding implementation form of the first aspect, the radiating structure further includes an inner ring and an outer ring. The diameter of the inner ring is less than the diameter of the outer ring. The inner and the outer ring have a same center point. Each first and each second arm has a first end point coupled to the inner ring. Each first arm has a second end point coupled to the outer ring. Each second arm has a second end point mechanically disconnected from the outer ring.

In a fifth implementation form of the radiating structure according to the first aspect as such or any preceding implementation form of the first aspect, the respective first capacitor and the respective third capacitor are a same capacitor coupled to the inner ring via a first conductive offset. The respective second capacitor is coupled to the outer ring via a second conductive offset. The respective fourth capacitor is coupled to the second end point of each second arm via a third conductive offset.

In a sixth implementation form of the radiating structure according to the first aspect as such or any preceding implementation form of the first aspect, the radiating structure further includes an inner and an outer ring. The diameter of the inner ring is less than the diameter of the outer ring. The inner and the outer ring have a same center point. Each first and each second arm has a first end point coupled to the outer ring. Each first arm has a second end point coupled to the inner ring. Each second arm has a second end point mechanically disconnected from the inner ring.

In a seventh implementation form of the radiating structure according to the first aspect as such or any preceding implementation form of the first aspect, the respective first capacitor and the respective third capacitor are a same capacitor coupled to the outer ring via a first conductive offset. The respective second capacitor is coupled to the inner ring via a second conductive offset. The respective fourth capacitor is coupled to the second end point of each second arm via a third conductive offset.

In an eighth implementation form of the radiating structure according to the first aspect as such or any preceding implementation form of the first aspect, each first and each second arm has a same length. The respective first capacitor is coupled to a first end of each first arm via a first conductive offset. The respective second capacitor is coupled to a second end of each first arm via a second conductive offset. The respective third capacitor is coupled to a first end of each second arm via a third conductive offset. The respective fourth capacitor is coupled to a second end of each second arm via a fourth conductive offset.

In a ninth implementation form of the radiating structure according to the first aspect as such or any preceding implementation form of the first aspect, each respective first capacitor is coupled to every other respective first capacitor. Each respective second capacitor is coupled to every other respective second capacitor. Each respective third capacitor is coupled to every other respective third capacitor. Each respective fourth capacitor is coupled to every other respective fourth capacitor.

In a tenth implementation form of the radiating structure according to the first aspect as such or any preceding implementation form of the first aspect, the radiating structure further includes an inner ring and an outer ring. The diameter of the inner ring is less than the diameter of the outer ring. The inner and outer ring have a same center point. Each first and each second arm has a first end point coupled to the inner ring. Each first and second arm has a second end point coupled to the outer ring.

In an eleventh implementation form of the radiating structure according to the first aspect as such or any preceding implementation form of the first aspect, in the second mode of operation, a density profile of a plasma generated by the resonating structure is radially controlled by adjusting RF waveforms corresponding to each resonant circuit.

A second aspect relates to a radiating structure of a resonating structure used for plasma processing. The radiating structure includes a set of first arms and a set of second arms. The set of first arms is coupled to a first capacitive plate of the resonating structure at a first end and a second capacitive plate of the resonating structure at a second end to form a set of first resonant circuits operating at a first resonance frequency. The set of second arms is coupled to the first capacitive plate of the resonating structure at a first end and to a third capacitive plate of the resonating structure at a second end to form a set of second resonant circuits operating at a second resonance frequency. In a first mode of operation, the resonating structure operates as a single resonance antenna. In a second mode of operation, the resonating structure operates as a parallel resonance antenna.

In a first implementation form of the radiating structure according to the second aspect as such, in the second mode of operation, a density profile of a plasma generated by the resonating structure is radially controlled by adjusting RF waveforms corresponding with the first resonance frequency and the second resonance frequency.

In a second implementation form of the radiating structure according to the second aspect as such or any preceding implementation form of the second aspect, the first capacitive plate is formed by a first conductive plate, a first dielectric, and a bottom side of a housing of the resonating structure. The second capacitive plate is formed by a second conductive plate, a second dielectric, and the bottom side of the housing of the resonating structure. The third capacitive plate is formed by a third conductive plate, a third dielectric, and the bottom side of the resonating structure.

In a third implementation form of the radiating structure according to the second aspect as such or any preceding implementation form of the second aspect, the set of first arms and the set of second arms are arranged in a repeating radial pattern.

In a fourth implementation form of the radiating structure according to the second aspect as such or any preceding implementation form of the second aspect, each first arm has a same first length, and each second arm has a same second length different than the first length.

A third aspect relates to resonating structure for plasma processing. The resonating structure includes a first, a second, a third, and a fourth capacitive plate; a set of first arms coupled to the first capacitive plate at a first end and to the second capacitive plate at a second end to form a set of first resonant circuits operating at a first resonance frequency; and a set of second arms coupled to the third capacitive plate at a first end and to the fourth capacitive plate at a second end to form a set of second resonant circuits operating at a second resonance frequency. In a first mode of operation, the resonating structure operates as a single resonance antenna. In a second mode of operation, the resonating structure operates as a parallel resonance antenna.

In a first implementation form of the resonating structure according to the third aspect as such, in the second mode of operation, a density profile of plasma generated by the resonating structure is radially controlled by adjusting RF waveforms corresponding with the first resonance frequency and the second resonance frequency.

In a second implementation form of the resonating structure according to the third aspect as such or any preceding implementation form of the third aspect, the first capacitive plate is formed by a first conductive plate, a first dielectric, and a bottom side of a housing of the resonating structure. The second capacitive plate is formed by a second conductive plate, a second dielectric, and the bottom side of the housing of the resonating structure. The third capacitive plate is formed by a third conductive plate, a third dielectric, and the bottom side of the resonating structure. The fourth capacitive plate is formed by a fourth conductive plate, a fourth dielectric, and the bottom side of the resonating structure.

In a third implementation form of the resonating structure according to the third aspect as such or any preceding implementation form of the third aspect, each first and each second arm is an Archimedean spiral. Each first arm has the same first length, and each second arm has the same second length different than the first length.

In a fourth implementation form of the resonating structure according to the third aspect as such or any preceding implementation form of the third aspect, each first and each second arm is an Archimedean spiral, and each first arm and each second arm has the same length.

Embodiments can be implemented in hardware, software, or in any combination thereof.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

Figure 1:
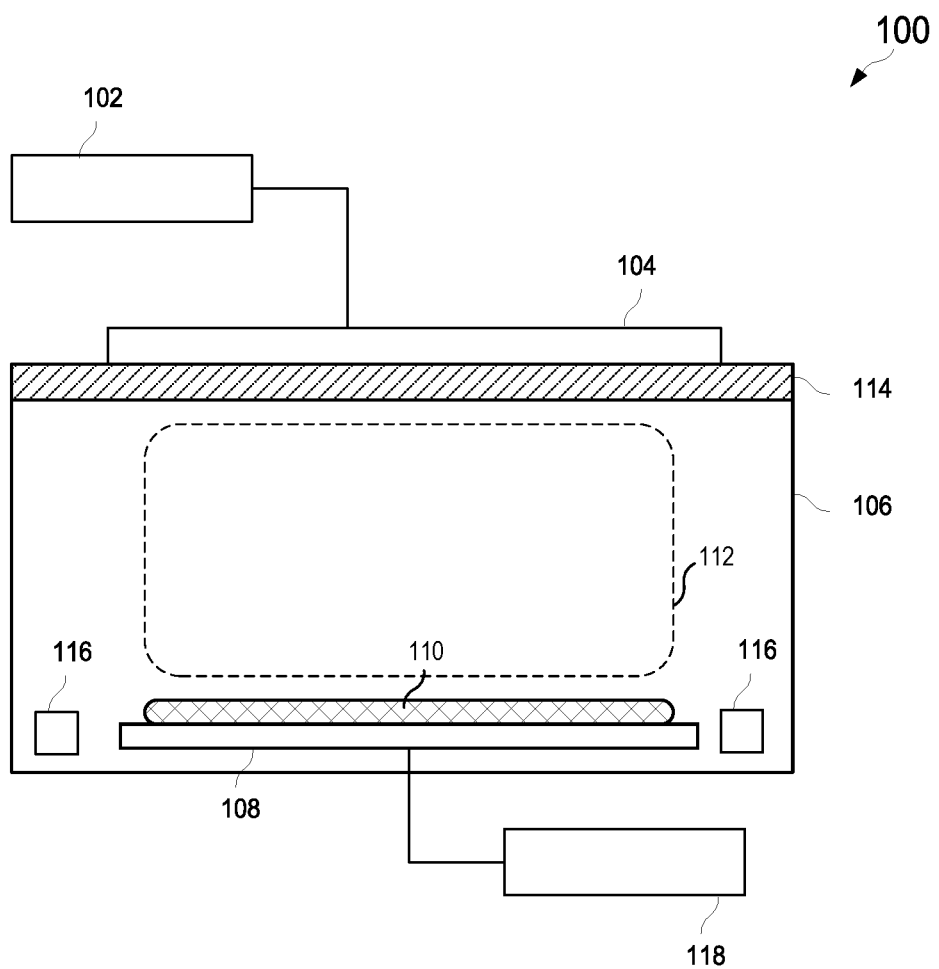
FIG. 1 is a diagram of an embodiment plasma processing system.

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described to one of the embodiments may also apply to other embodiments. Further, it should be understood that various changes, substitutions, and alterations can be made herein without departing from the spirit and scope of this disclosure as defined by the appended claims.

While inventive aspects are described primarily in the context of treating substrates, the inventive aspects may be similarly applicable to fields outside the semiconductor industry. Plasma can be used to treat and modify surface properties through functional group addition. For example, to treat surfaces for paint deposits, plasma can convert hydrophobic surfaces to hydrophilic surfaces. Further, the inventive aspects are not limited to plasma. For example, RF can be used to thaw frozen food or dry out textiles, food, wood, or the like. In these various examples and across industries, radial distribution control of an oscillating magnetic field, as disclosed herein, is advantageous.

In various embodiments, a reference to magnetic fields refers to magnetic fields oscillating at some frequency, for example, at one of RF or microwave frequencies. In these embodiments, the magnetic fields do not refer to DC magnetic fields.

In embodiments, an antenna is proposed that allows radial distribution control of plasma for semiconductor plasma processing, providing for a controlled center-to-edge variation in the plasma density profile. In one mode of operation, the antenna is configured to simultaneously resonate at different resonant frequencies with multiple resonant zones. In a second mode of operation, the antenna is configured to resonate at a single resonant frequency with a single resonant zone. In a third mode of operation, the antenna is configured to resonate at a single resonant frequency but with multiple resonant zones. Other configurations are contemplated as detailed below.

In various embodiments, radiating structures are proposed having a plurality of spiral arms. The arms form a resonant circuit with capacitors of the resonating structure to which the radiating structure belongs. The resonating circuits can be grouped into sets, and within each set, the resonant circuits can have the same resonant frequencies. In embodiments, the arms in each set are equal but different from the arms in the other sets. In other embodiments, the arms are similar to the arms in the other sets. In such embodiments, the resonating structure capacitors provide for the resonant circuit variation that differentiates each set's resonance. In embodiments, the arms are spiral arms. In other embodiments, the arms are straight-line (i.e., radial). These and further details are discussed in greater detail below.

FIG. 1 illustrates a diagram of an embodiment plasma processing system 100. Plasma processing system 100 includes an RF source 102, a resonating structure 104, a plasma chamber 106, and, optionally, a dielectric plate 114, which may (or may not) be arranged as shown in FIG. 1. Further, plasma processing system 100 may include additional components not depicted in FIG. 1.

In embodiments, RF source 102 includes an RF power supply, which may include a generator circuit and a matching circuit (not shown). RF source 102 is coupled to the resonating structure 104 via a power transmission line, such as a coaxial cable or the like. RF source provides forward RF waves to the resonating structure 104. Resonating structure 104 includes one or more radiating structures. The forward RF waves travel through the resonating structure 104 and are transmitted (i.e., radiated) towards plasma chamber 106.

Plasma chamber 106 includes a substrate holder 108. As shown, substrate no is placed on substrate holder 108 to be processed. Optionally, plasma chamber 106 may include a bias power supply 118 coupled to substrate holder 108. The plasma chamber 106 may also include one or more pump outlets 116 to remove by-products from plasma chamber 106 through selective control of gas flow rates within. In embodiments, pump outlets 116 are placed near (e.g., below/around the perimeter of) substrate holder 108 and substrate no. In embodiments, plasma chamber 106 may include additional substrate holders (not shown). In embodiments, the placement of the substrate holder 108 may differ from that shown in FIG. 1. Thus, the quantity and position of the substrate holder 108 are non-limiting.

In embodiments, resonating structure 104 is separated from plasma chamber 106 by the dielectric plate 114, which is typically made of a dielectric material. Dielectric plate 114 separates the low-pressure environment within the plasma chamber 106 from the external atmosphere. It should be appreciated that resonating structure 104 can be placed directly adjacent to the plasma chamber 106, or resonating structure 104 can be separated from plasma chamber 106 by air. In embodiments, the dielectric plate 114 is selected to minimize reflections of the RF wave from the plasma chamber 106. In other embodiments, the resonating structure 104 is embedded within the dielectric plate 114.

In embodiments, resonating structure 104 radiates an electromagnetic field towards the plasma chamber 106. The radiated electromagnetic field generates an azimuthally symmetric, high-density plasma 112 with low capacitively coupled electric fields.

In an embodiment, the resonating structure 104 includes arms connected to capacitive structures that generate the azimuthal symmetry, as disclosed herein. In embodiments, the excitation frequency of the resonating structure 104 is in the radio frequency range (10-400 MHz), which is not limiting, and other frequency ranges can similarly be contemplated. For example, inventive aspects disclosed herein equally apply to applications in the microwave frequency range.

In embodiments, the resonating structure 104 includes resonant elements. The resonant elements can be arms that are electrically connected to capacitive structures of the resonating structure 104. The arms and the capacitive structures are resonant with electromagnetic waves fed from the RF source 102.

In embodiments, resonant elements sustain standing electromagnetic waves. The standing electromagnetic waves have regions where the electric field is high and other regions where the magnetic field is high. The regions where the magnetic fields are high consist of conductive paths. The resonant elements are placed close to and parallel to the dielectric plate 114 such that the oscillating magnetic field from the resonant elements penetrates into the plasma chamber 106. The time-varying magnetic field induces a time-varying electric field, which transfers energy to plasma electrons.

In embodiments, the resonating structure 104 includes regions where the electric field is high (i.e., located away from the dielectric plate 114). In embodiments, such regions consist of metal structures with a flat surface. In embodiments, the flat surfaces of two of the metal pieces are opposed and separated by a dielectric. The volume between the two metal pieces occupied by the dielectric is the location of the high electric fields in the respective resonant circuit of the resonating structure 104.

In other embodiments, the metal pieces may have cylindrical or other geometries. In all cases, two metal surfaces are separated by a region filled with a dielectric material, which may also be air or vacuum.

The magnetic fields in the high magnetic field elements are due to currents that flow along these elements. The electric fields in the high electric field elements are due to the presence of charge. The elements with high electric fields are connected with other such elements through the elements with high magnetic fields such that charge flows from one region of a high electric field to another region of high electric fields by a current, which produces the magnetic field in the high magnetic field elements.

In an embodiment, the high electric field elements may also be connected so that the electric fields in the resonating structure 104 are in phase and have the same amplitudes. However, this feature is non-limiting.

In embodiments, the high magnetic field elements and the high electric field elements are all approximately identical to each other.

In embodiments, the elements of the resonating structure 104 are arranged about a central axis of symmetry. In an embodiment, the central axis of symmetry is perpendicular to the dielectric plate 114. In an embodiment where the dielectric plate 114 is in the shape of a disk, the central axis of symmetry passes through the disk's center.

In embodiments, the RF source 102 couples energy to an interface of the resonating structure 104 to generate the standing electromagnetic waves from the resonating structure 104. The RF source 102 is coupled to the interface via a transmission line in embodiments. It is desirable that the interface maintain the same or higher symmetry as the elements of the resonating structure 104 under rotation about the axis of symmetry.

In embodiments, the interface couples energy to the portion of the resonating structure 104 where the electric field is high—capacitive coupling. In embodiments, the interface couples energy to the portion of the resonating structure 104 where the magnetic field is high—inductive coupling. In both cases, it is possible to arrange the interface such that electromagnetic fields produced by the resonating structure 104 may penetrate into the plasma chamber 106, thereby creating plasma 112 in their own right.

In an embodiment, the resonating structure 104 couples RF power from RF source 102 to the plasma chamber 106 to treat substrate no. In particular, resonating structure 104 radiates an electromagnetic wave in response to being fed the forward RF waves from the RF source 102. The radiated electromagnetic wave penetrates from the atmospheric side (i.e., resonating structure 104 side) of the dielectric plate 114 into plasma chamber 106. The radiated electromagnetic wave generates an electromagnetic field within the plasma chamber 106. The generated electromagnetic field ignites and sustains plasma 112 by transferring energy to free electrons within the plasma chamber 106. The plasma 112 can be used to, for example, selectively etch or deposit material on substrate no.

In FIG. 1, resonating structure 104 is external to the plasma chamber 106. In embodiments, however, resonating structure 104 can be placed internal to the plasma chamber 106.

In embodiments, the operating frequency of resonating structure 104 is between 5 and 100 megahertz (MHz). In embodiments, the power delivered by resonating structure 104 ranges from 10 to 5000 Watts (W)—determined by various factors such as distance from the resonating structure 104, impedance values, or the like.

Figure 2A:
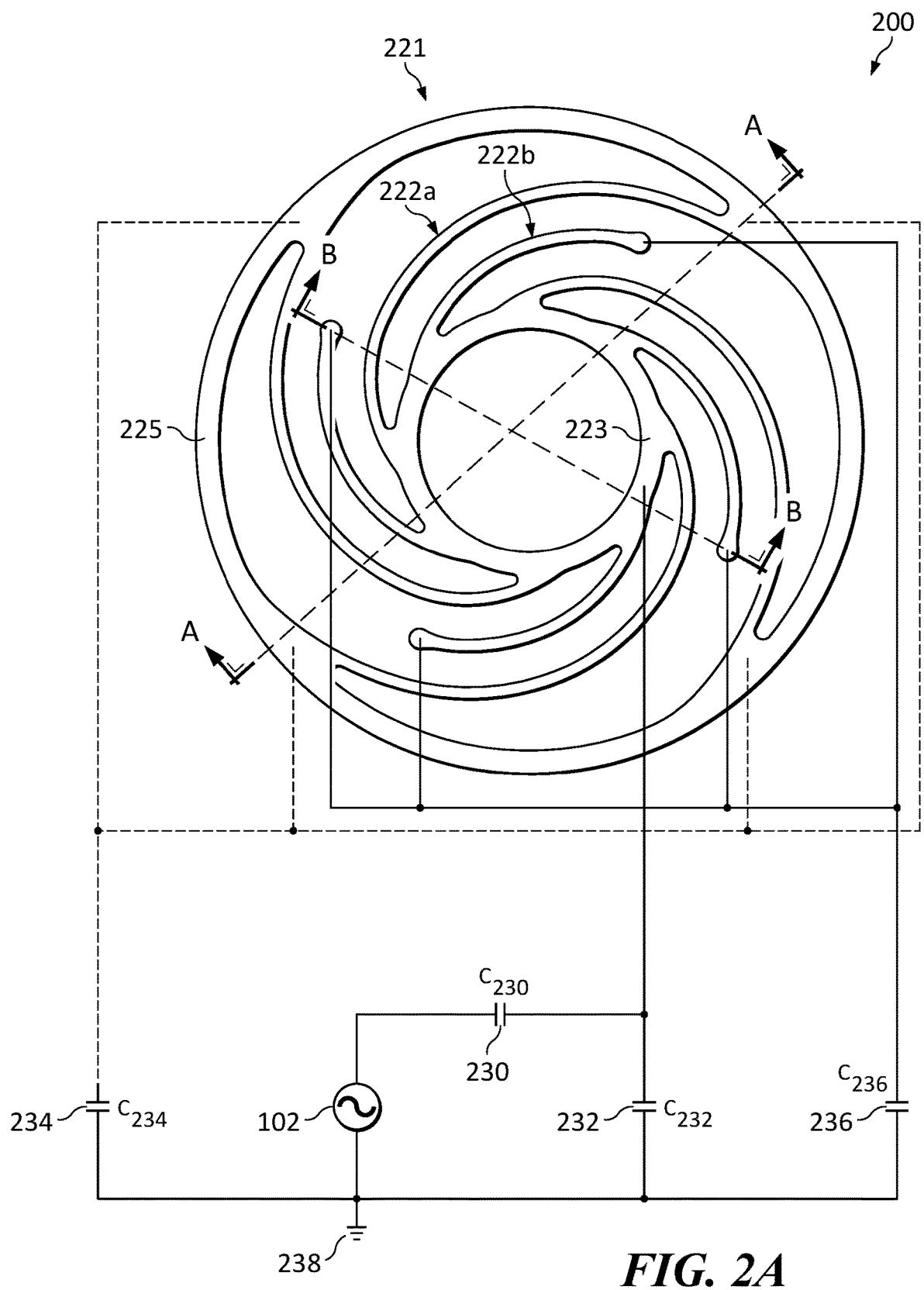
FIG. 2A is a hybrid schematic/drawing of an embodiment resonating structure.
Figure 2B:
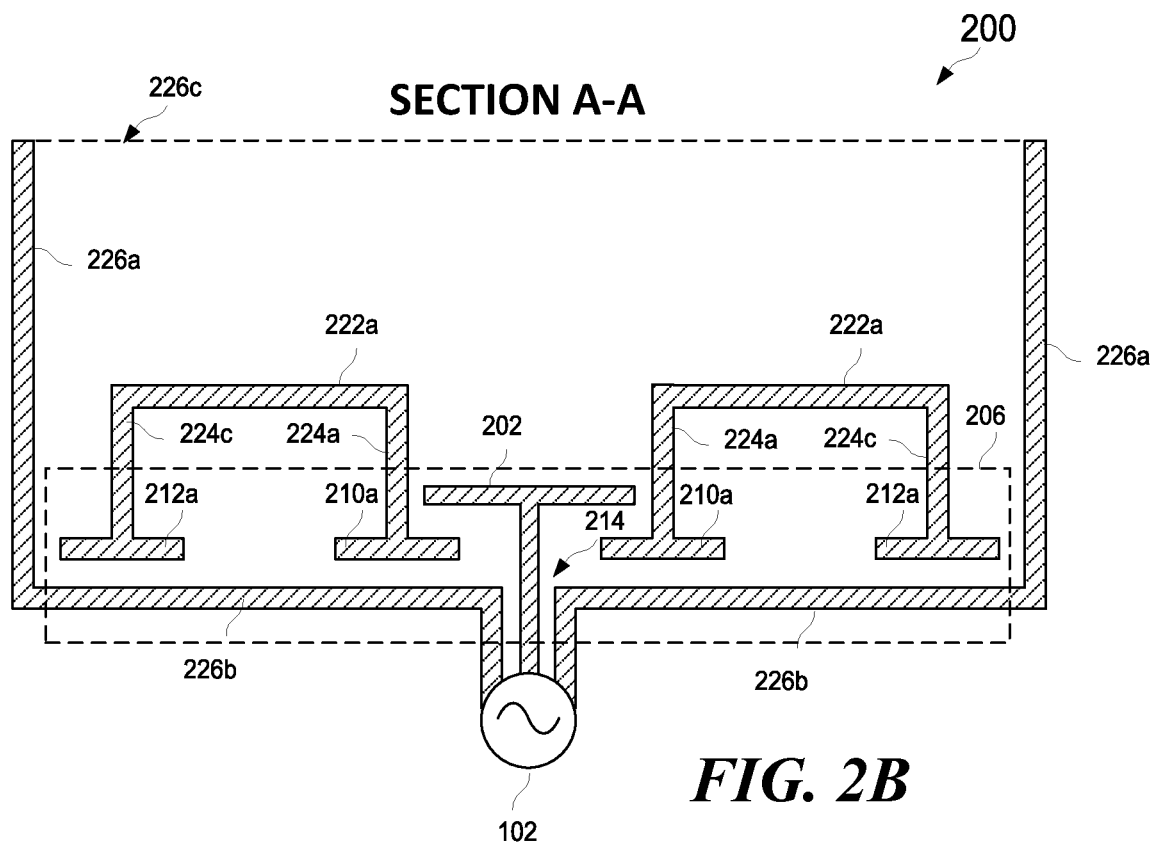
FIG. 2B is an A-A cross-sectional view of the embodiment resonating structure of FIG. 2A.
Figure 2C:
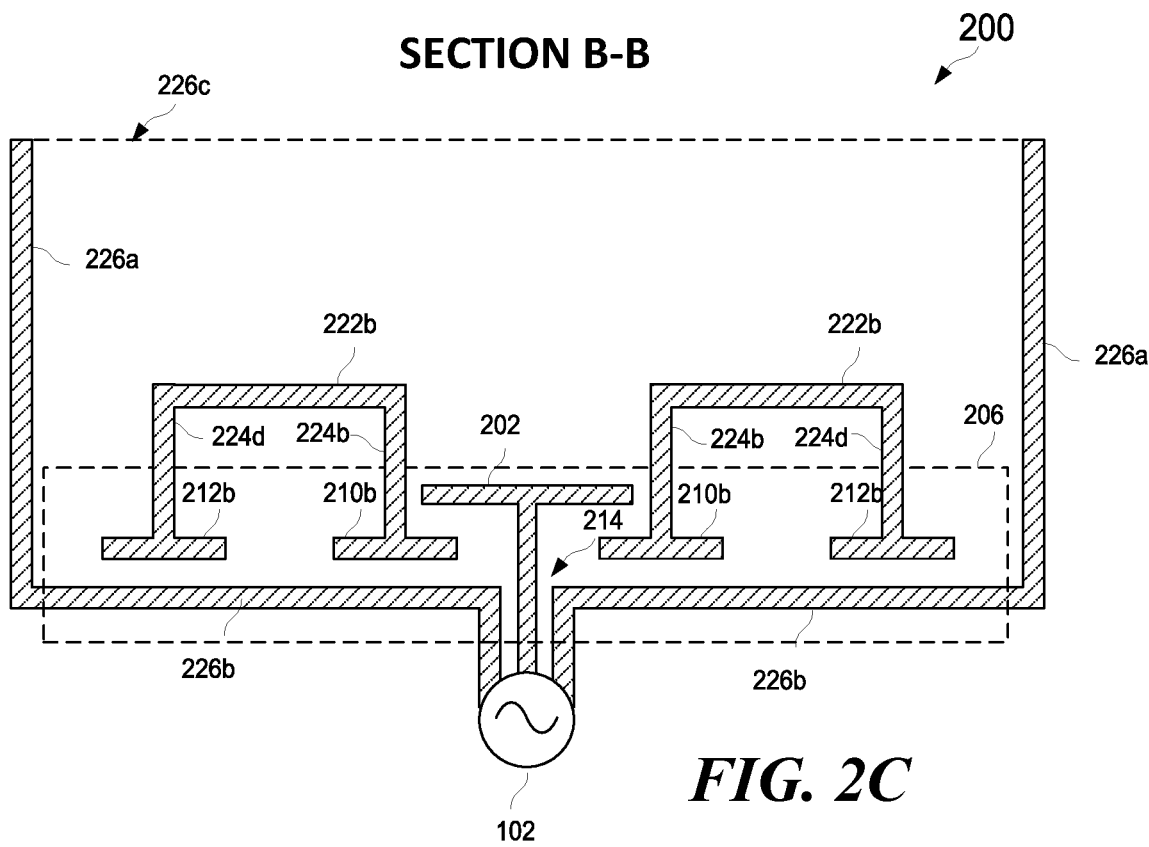
FIG. 2C is a B-B cross-sectional view of the embodiment resonating structure of FIG. 2A.

FIG. 2A illustrates a hybrid schematic/drawing of an embodiment resonating structure 200. FIG. 2B illustrates an A-A cross-sectional view of the resonating structure. FIG. 2C illustrates a B-B cross-sectional view of the resonating structure.

In FIG. 2A, an embodiment radiating structure 221 of the resonating structure 200 is shown illustratively. Other portions of the resonating structure 200 that feed the radiating structure 221 with RF power are shown in schematic form.

The radiating structure 221 may also be referred to as an antenna plate or a radiating element. The radiating structure 221 is shown as a unibody, conductive, planar, ring-shaped, monolithic structure. The radiating structure 221 includes an inner ring 223, an outer ring 225, a set of first arms 222a, and a set of second arms 222b. Each arm 222a-b has an n-fold symmetry about an axis, which passes through the center point of the radiating structure 221.

Although each arm of the set of first arms 222a and set of second arms 222b, in the radiating structure, is shown as a spiral arm, the spiral shape of the arm is non-limiting. For example, in an embodiment, the arm can be a radial arm (e.g., a straight-line) without any curvature. In embodiments where the arm is in the form of a spiral, the spiral can be, but is not limited to, an Archimedean, a logarithmic, a Fibonacci, or an involute of circle type of spiral.

Radiating structure 221 is shown as a solid conductive plate having cutouts to form the arms 222a-b. However, it should be appreciated that the unibody design of the radiating structure 221 is non-limiting, and structures formed by, for example, individual components for the inner ring 223, outer ring 225, first and set of second arms 222a-b are envisioned in other embodiments. Further, it should be appreciated that in embodiments, the radiating structure 221 can include a plurality of wires arranged in a spiral configuration. In these embodiments, each wire is connected to an inner ring on one end and an outer ring on the other.

In embodiments, the radiating structure 221 is formed by the first and set of second arms 222a-b without an inner ring 223 or the outer ring 225. In other embodiments, the radiating structure 221 is formed by the first and set of second arms 222a-b and only one of the inner ring 223 or the outer ring 225.

In embodiments, the arms 222a-b are formed using, for example, copper tubing. In embodiments, the arms 222a-b are formed by individually machined pieces made from, for example, aluminum.

In embodiments, the radiating structure 221 is a conductive plate with a plurality of axisymmetric spiral cutouts that form the arms 222a-b. In embodiments where the radiating structure 221 is formed from a conductive plate, the assembly and mechanical inconsistencies of the resonating structure are minimized due to the generally tight tolerances in fabrication and manufacturing. Advantageously, such a structure provides for more robust and repeatable electromagnetic waves. Furthermore, the radiating structure 221 design provides for scaling to accommodate multiple radial zones with respect to the generated electromagnetic fields.

In embodiments, the endpoints of each arm 222a-b are disposed at different angles measured from the center point of the radiating structure 221 (i.e., spiral arm embodiments). In embodiments, the endpoints of each arm 222a-b are disposed at the same angle measured from the center point of the radiating structure 221 (i.e., radial arm embodiments).

In embodiments, each arm 222a-b is additionally supported by one or more non-conductive offsets along the arc of the arm 222a-b.

In embodiments, each first arm 222a has the same straight-line distance between its ends. In embodiments, each second arm 222b has the same straight-line distance between its end.

In embodiments, the straight-line distance between the ends of each first spiral arm 222a is different from the straight-line distance between the ends of each second spiral arm 222b. In embodiments, the straight-line distance between the ends of each first spiral arm 222a is the same straight-line distance as that between the ends of each second spiral arm 222b.

In embodiments, the arrangement of arms 222a-b includes arranging the arms 222a-b such that the geometry of the arms 222a-b is unchanged during a rotation of the radiating structure 221 about an axis of symmetry.

Each arm has an associated inductance value based on its physical dimensions and material make-up. Thus, an inductor is formed by each arm along which there is a phase shift in the propagating electromagnetic wave, consistent in sign with the phase change of an ideal lumped circuit inductor.

It should be appreciated that in embodiments, as further discussed below, a conductive offset mechanically and conductively attaches the endpoints of each arm to capacitive plates in the interface structure of the resonating structure. In such embodiments, the use of the language, an inductor formed by the arms, is for ease and simplification of the discussion and non-limiting. For example, it should be understood that the conductive offsets in combination with the respective arms, in a general sense, form an inductor of a resonating structure.

As shown, in the radiating structure 221, a first end of each first arm 222a is connected to the inner ring 223 and connected at the other end to the outer ring 225. The inner ring 223 is coupled to the first terminal of the first capacitor 230 and the first terminal of the second capacitor 232. The second terminal of the first capacitor 230 is coupled to the RF source 102. The second terminal of the second capacitor 232 is coupled to RF ground 238. The outer ring 225 is coupled to the first terminal of a third capacitor 234. The second terminal of the third capacitor is coupled to RF ground 238.

In embodiments, where the radiating structure 221 does not include the inner ring 223, the first end of each first arm 222a is connected to the first terminal of the first capacitor 230 and the first terminal of the second capacitor 232.

Although in FIG. 2A, the representation is that of a capacitive coupling resonating structure, it should be appreciated that the present disclosure similarly contemplates an inductive coupling resonating structure. Thus, the capacitive coupling resonating structure in FIG. 2A is non-limiting.

In embodiments, a first end of each arm 222b is connected to the inner ring 223. The other end of each arm 222b is coupled to the first terminal of a fourth capacitor 236. The second terminal of the fourth capacitor 236 is coupled to the RF ground 238.

In embodiments, where the radiating structure 221 does not include the inner ring 223, the first end of each arm 222b is connected to the first terminal of the first capacitor 230 and the first terminal of the second capacitor 232 through conductive offsets as discussed in further detail below.

As shown, the second capacitor 232, the third capacitor 234, and each first arm 222a form a respective first resonant circuit (i.e., LC resonant circuit). The second capacitor 232, the fourth capacitor 236, and each second arm 222b form a respective second resonant circuit (i.e., LC resonant circuit).

In embodiments, the coupling to RF ground of the first terminal of the third capacitor 234, the first terminal of the fourth capacitor 236, or both terminals may be electrically or mechanically adjusted. For example, a switch (not shown) with a first terminal coupled to the first terminal of the third capacitor 234 or the first terminal of the fourth capacitor 236 and a second terminal coupled to the RF ground 238 may act to alter the coupling to RF ground 238.

As another example, the capacitive values associated with the third capacitor 234 and the fourth capacitor 236 of resonant system 200 may be chosen, such that the first and second resonant circuits operate at the same frequency. In such embodiments, when the capacitance of either the third capacitor 234 or the fourth capacitor 236 is altered, respectively, the first or second resonant circuit's resonant frequency is shifted. In this mode of operation, the shifted resonant circuit can be removed from operation because the new resonant frequency is removed from the original single frequency.

In embodiments, the shifted resonant circuit coupled to RF ground remains operational; however, the current distribution and the associated plasma generated therefrom are shifted. In such embodiments, the resonating structure 200 can operate as a single resonance antenna or a parallel resonance antenna based on the desired application and configuration of the resonating structure 200.

For clarity, parallel resonance, as used in the present disclosure, is not to be interpreted in the usual technical electrical engineering sense where two or more circuit elements have a common voltage across them. Generally, in RF applications, voltage is path-dependent. Hence, a parallel circuit element concept defined in terms of voltage is not strictly applicable. The term as used herein—in a looser, non-technical sense—is meant that two RF elements, which are individually resonant, spatially adjoin, or adjacent to each other. They can be temporarily excited at the same time, or each can be excited in a pulse separately in time from the other.

In embodiments, the second capacitor 232 and the third capacitor 234 provide a low impedance path to the first resonant circuit and, specifically, to the radiating elements (i.e., set of first arms 222a) of the radiating structure 221.

In embodiments, the second capacitor 232 and the fourth capacitor 236 provide a low impedance path to the second resonant circuit and, specifically, to the radiating elements (i.e., set of second arms 222b). In embodiments, the inner ring 223 and outer ring 225 of the radiating structure 221 form low impedance paths at the frequencies of interest for each resonant circuit.

Here, RF source 102 is shown as an AC power supply. In embodiments, the RF source 102 is configured to provide a forward RF wave to each arm, which is radiated by the first and second resonant circuits.

The resonant frequency of each resonant circuit is based on the various electrical and mechanical parameters of the structural components of the associated capacitors and the arms, respectively.

In embodiments, the difference in arm length in each set allows for a difference in inductance at each resonant circuit. In some embodiments, the second capacitor 232, the third capacitor 234, and the fourth capacitor 236 are variable capacitors. In such embodiments, the resonant frequency of each resonant circuit can be adjusted by varying the capacitance values of the variable capacitors.

In embodiments, the changing of the balance of power between the resonant frequency of the set of first arms 222a and the resonant frequency of the set of second arms 222b, moves the radius of the maximum field of the azimuthally averaged fields, which includes both sets of arms, radially. Based on these arrangements, a variation of the power ratio between the associated frequency of each resonance circuit can vary the high field point on the set of first arms 222a given the set of second arms 222b, which directly impacts the density profile of the generated plasma by the resonating structure 200.

Thus, in one operating mode, the resonating structure 200 is configured to simultaneously resonate at different resonant frequencies through the first and second resonant circuits, allowing for a center-to-edge variation of the plasma density profile. The resonating structure 200, in a second operating mode, can resonate at a single frequency with a single resonant zone by adjusting the capacitive values of the resonant circuits to operate at the same resonant frequency. The resonating structure 200, in a third operating mode, can resonate at a single resonant frequency but with multiple resonant zones. In embodiments where the resonating structure can operate in more than two resonances, different combinations of active resonant frequencies are similarly contemplated.

Although the set of arms in the radiating structure 221 is shown to have four arms, this number is non-limiting, and different arm numbers are contemplated. Further, although the radiating structure 221 is shown to have two resonating circuits due to the two sets of arms 222a-b, it should be appreciated that a radiating structure having more than two sets of arms is similarly contemplated. In such embodiments, each set of arms allows for a separate resonating structure.

Thus, in an embodiment with N set of arms and with M arms in each set, the radiating structure has M number of resonating circuits that operate at the same resonance, of which there are N different types of resonant circuits—M and N are positive integer numbers. In a different embodiment, each N set may have a different number of arms.

Referring to FIG. 2B, which is an A-A cross-sectional view of the resonating structure 200, two arms of the set of first arms 222a are shown. Referring to FIG. 2C, which is a B-B cross-sectional view of the resonating structure 200, two arms of the set of second arms 222b are shown. Each first arm 222a and second arm 222b is coupled to an interface structure 206 of the resonating structure 200 via respective conductive offsets 224a-d.

Although the resonating structure 200 is shown to be coupled to the RF source 102 using capacitive coupling, other arrangements, such as inductive coupling, are similarly contemplated. The capacitive and inductive coupling arrangements are discussed in detail in U.S. application Ser. No. 17/664,607, U.S. application Ser. No. 17/649,823, and U.S. application Ser. No. 17/748,737, which are hereby incorporated herein by reference in their entirety.

Additionally shown is housing 226a-c, which surrounds the resonating structure 200. Housing 226a-c includes a housing sidewall 226a, a housing bottom side 226b, and a housing top side 226c. Housing sidewall 226a and housing bottom side 226b are conductive structures. The housing top side 226c is illustrated with a dashed line representing an open surface of housing 226a-c.

The housing bottom side 226b is electrically coupled to the RF ground 238 of RF source 102. As such, the entirety of housing 226a-c is RF grounded. The housing bottom side 226b includes an opening to couple an RF feed path from RF source 102 to interface structure 206.

In an embodiment, the housing top side 226c is positioned adjacent to the bottom of the plasma chamber 106. In reference to FIG. 1, the resonating structure 200 is flipped upside down, and the housing top side 226c of resonating structure 200 is positioned such that the dielectric plate 114 is flush with the housing top side 226c. In such an embodiment, the dielectric plate 114 is located above the radiating structure 221 in the direction of the housing top side 226c. The resonating structure 200 generates electromagnetic waves that radiate through the dielectric plate 114 towards the plasma chamber 106 in a direction from the housing bottom side 226b to the housing top side 226c.

Resonating structure 200 may operate as the resonating structure 104 in the plasma processing system 100 in FIG. 1. It is noted that the resonating structure 200 is not limited to an application in plasma processing, and other applications are contemplated. Further, the resonating structure 200 may include additional components not depicted in FIGS. 2A-C, such as non-conductive offsets to provide extra structural rigidity to the resonating structure 200 by mechanically connecting radiating structure 221 to interface structure 206.

Interface structure 206 includes a drive disk 202, a capacitive inner ring 210a-b, a capacitive outer ring 212a-b, and an insulating structure 214. The drive disk 202 is a conductive, circular structure couplable to the RF source 102 and used to provide RF waves to the radiating structure 221. In embodiments, the drive disk 202 is coupled to the RF source 102 via a rigid, semi-rigid, or flexible coaxial cable. In other embodiments, the drive disk 202 is coupled to an RF or microwave generator via any one of a variety of types of transmission lines, such as a rectangular waveguide, two parallel conductive ribbons (e.g., triax) with two cylindrical conductors contained within a larger hollow cylinder, or the like.

Capacitive inner ring 210a-b and capacitive outer ring 212a-b are conductive structures. As shown, the capacitive outer ring 212a-b is arranged adjacent to the capacitive inner ring 210a-b and substantially on the same plane. In embodiments, however, the capacitive outer ring 212a-b may be on a different plane than the capacitive inner ring 210a-b. Regardless, the surface areas and the insulating structure 214 forming the respective capacitive plates may be adjusted to have the same or different capacitances.

The capacitive outer ring 212a-b and capacitive inner ring 210a-b are conductive, ring-shaped plates with an inner and outer radius. In embodiments, the capacitive outer ring 212a-b and capacitive inner ring 210a-b have the same center point as the drive disk 202. And the inner radius of the capacitive outer ring 212a-b is greater than the outer radius of the capacitive inner ring 210a-b. The inner radius of the capacitive inner ring 210a-b is less than the outer radius of the drive disk 202.

In embodiments, capacitive inner ring 210a-b is a single conductive structure, effectively forming a single capacitive inner ring. In other embodiments, each capacitive inner ring 210a-b is a single conductive structure. In such embodiments, the multiple conductive structures may be electrically isolated from each other (e.g. 210a and 210b). In embodiments, capacitive outer ring 212a-b is a single conductive structure, effectively forming a single capacitive outer ring. In other embodiments, each capacitive outer ring 212a-b is a single conductive structure. In such embodiments, the multiple conductive structures may be electrically isolated from each other (e.g. 212a and 212b).

For example, in embodiments, each first arm 222a is coupled at one end to a first conductive structure of capacitive inner ring 210a, and each second arm 222b is coupled at one end to a second conductive structure of capacitive inner ring 210a. The first and second conductive structures of capacitive inner ring 210a-b may be electrically coupled to each other in one set of embodiments, and they may be electrically isolated from each other in a different set of embodiments.

Likewise, in embodiments, each first arm 222a is coupled at one end to a first conductive structure of capacitive outer ring 212a, and each second arm 222b is coupled at one end to a second conductive structure of capacitive inner ring 212b. The first and second conductive structures of capacitive outer ring 212a-b may be electrically coupled to each other in one set of embodiments, and they may be electrically isolated from each other in a different set of embodiments.

In embodiments, RF source 102 is electromagnetically coupled to capacitive inner ring 210a-b via drive disk 202. Although not shown, and as previously mentioned, the RF source 102 can be coupled to the resonant structure using inductive coupling. Thus, the method of coupling of the RF source 102 is non-limiting.

Because FIGS. 2B-C illustrate cross-sectional views of the resonating structure 200, it should be appreciated that in embodiments, there is an axis of symmetry at the center of the resonating structure 200. In embodiments, the resonating structure 200 has a cylindrical structure. In these embodiments, for example, the portion of the capacitive outer ring 212a-b shown on the left side of the drive disk 202 and the portion of the capacitive outer ring 212a-b shown on the right side of the drive disk 202 are part of the same conductive ring structure. Further, similar symmetry exists with other components of the resonating structure 200 with respect to the center of the resonating structure, such as the capacitive inner ring 210a-b, radiating structure 221, etc.

Insulating structure 214 consists of an electrically insulating material such as a dielectric material or the like. In embodiments, the insulating structure 214 consists of air or vacuum. The insulating structure 214 is arranged between drive disk 202, capacitive inner ring 210a-b, capacitive outer ring 212a-b, and housing bottom side 226b.

In embodiments, the interface structure 206 is embedded in an insulating medium, such as air or dielectric (i.e., insulating structure 214). Although the arrow designating the insulating structure 214 is shown to point to an area—more appropriately, a volume of the interface structure 206 in FIG. 2A—it should be appreciated that the arrow is meant to imply that the insulating structure 214 covers the area or volume surrounding the different conductive and non-conductive material of the resonating structure 200.

In embodiments, insulating structure 214 may include multiple insulating structures with, for example, different dielectric parameters, effectively forming a single insulating structure between the various conductive components of interface structure 206. In other embodiments, insulating structure 214 may be a single insulating structure formed between the various conductive components of interface structure 206.

Conductive offsets 224a-d include a set of first inner conductive offsets 224a, a set of second inner conductive offsets 224b, a set of first outer conductive offsets 224c, and a set of second outer conductive offsets 224d.

As shown, conductive offsets 224a-d are arranged perpendicular to capacitive inner ring 210a-b, capacitive outer ring 212a-b, and radiating structure 221. However, conductive offsets 224a-d can also be arranged to vertically connect capacitive inner ring 210a-b and capacitive outer ring 212a-b to radiating structure 221 without being perpendicular to these surfaces.

In embodiments, the set of first inner conductive offsets 224a electrically couple the capacitive inner ring 210a to the inner ring 223 of the radiating structure 221. The outer set of conductive offsets 224c electrically couple the capacitive outer ring 212a to the outer ring 225 of the radiating structure 221.

Herein, for simplicity of discussion, each capacitive inner ring 210a-b and each capacitive outer ring 212a-b, respectively, is considered a single conductive structure. Thus, the capacitive plates forming a capacitor, as disclosed herein, is discussed in terms of a single corresponding structure. However, it should be understood that in embodiments, a capacitor can be formed separately with one of the capacitor inner ring 210a, one of the capacitor inner ring 210b, or both, as one side of a parallel capacitive plate, respectively. Likewise, a capacitor can be formed separately with one of the capacitor outer ring 212a, one of the capacitor outer ring 212b, or both, as one side of a parallel capacitive plate, respectively.

First capacitor 230 ($C_{230}$) is formed by drive disk 202, insulating structure 214, and the capacitive inner ring 210a-b. The drive disk 202 and capacitive inner ring 210a are conductive plates arranged in parallel to the other, sandwiching insulating structure 214 in-between, forming a parallel plate capacitor. The drive disk 202 is capacitively coupled to the capacitive inner ring 210a-b, as illustrated by the first capacitor 230.

Second capacitor 232 ($C_{232}$) is formed by housing bottom side 226b, insulating structure 214, and the capacitive inner ring 210a-b. The housing bottom side 226b and capacitive inner ring 210a-b are conductive plates arranged in parallel, sandwiching insulating structure 214 in-between, forming a parallel plate capacitor. In embodiments, the capacitance value of the second capacitor 232 is greater than 10 picofarads (pF). The capacitance value is substantially the same at each location of the parallel plate capacitor.

Third capacitor 234 ($C_{234}$) is formed by housing bottom side 226b, insulating structure 214, and the capacitive outer ring 212a-b. The housing bottom side 226b and capacitive outer ring 212a are conductive plates arranged in parallel, sandwiching insulating structure 214 in-between, forming a parallel plate capacitor. In embodiments, the capacitance value of the third capacitor 234 is greater than 10 picofarads (pF). The capacitance value is substantially the same at each location of the parallel plate capacitor.

Fourth capacitor 236 ($C_{236}$) is formed by housing bottom side 226b, insulating structure 214, and the capacitive outer ring 212a-b. The housing bottom side 226b and capacitive outer ring 212a-b are conductive plates arranged in parallel, sandwiching insulating structure 214 in-between, forming a parallel plate capacitor. In embodiments, the capacitance value of the second capacitor 232 is greater than 10 picofarads (pF). The capacitance value is substantially the same at each location of the parallel plate capacitor.

In embodiments, the second terminal of the second capacitor 232, the third capacitor 234, and the fourth capacitor 236 is a plate different than the housing bottom side 226b. For example, a separate capacitive plate may be positioned between the housing bottom side 226b and the capacitive outer ring 212b or capacitive inner ring 212a to form a parallel plate capacitor (not shown).

In some embodiments, the capacitance value of the third capacitor 234 is equal to the fourth capacitor 236. In other embodiments, the capacitance value of the third capacitor 234 is not equal to the fourth capacitor 236.

In an embodiment, an end of each of the inner set of conductive offsets 224a-b is arranged at an equal distance from each other along the surface of the capacitive inner ring 210a-b.

In an embodiment, an end of each of the outer set of conductive offsets 224c-d is arranged at an equal distance from each other along the surface of the capacitive outer ring 212a-b.

Figure 2D:
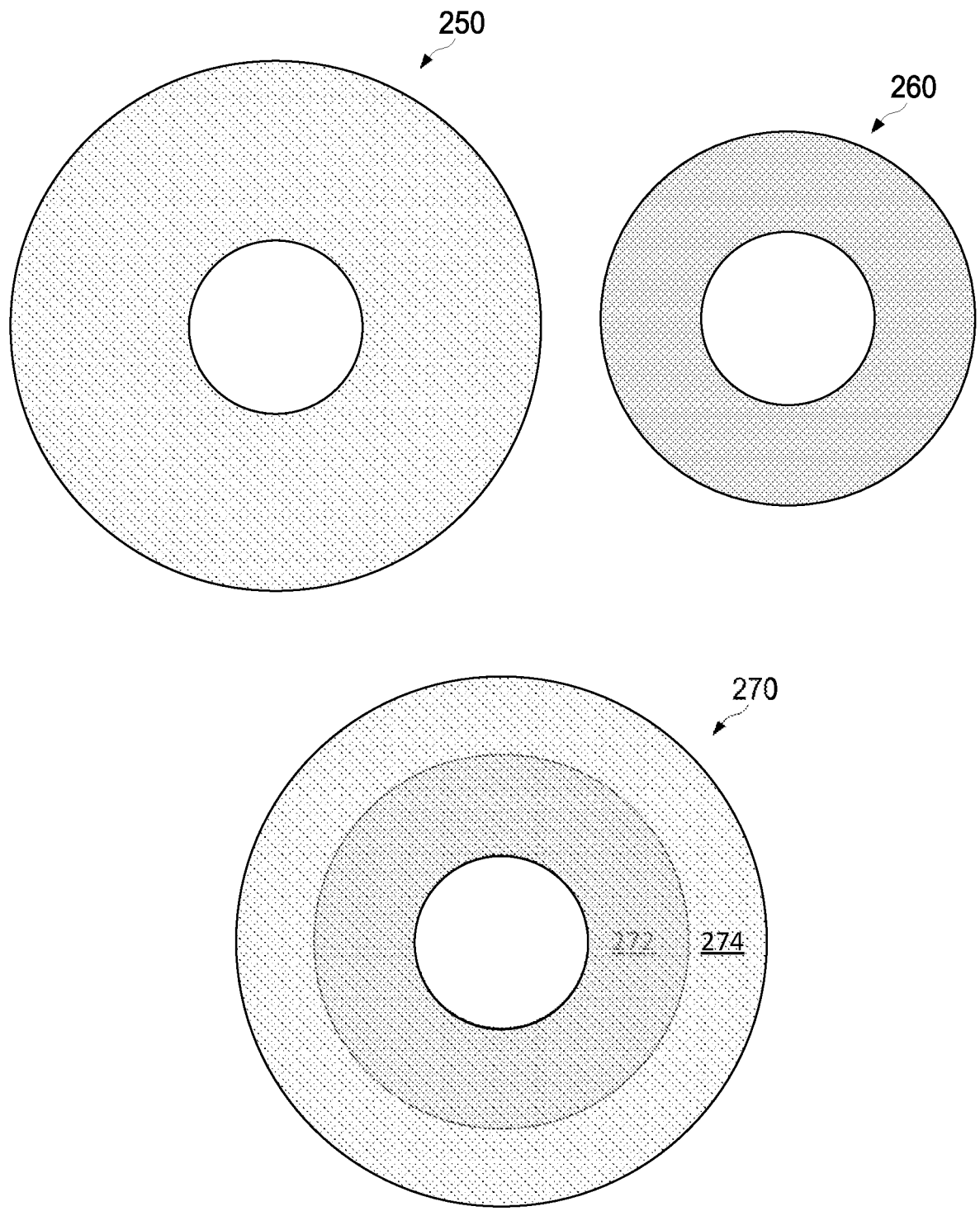
FIG. 2D is an illustration of resonance regions corresponding to one or more modes of the embodiment resonating structure of FIG. 2A.

FIG. 2D illustrates a first resonance region 250 from the first resonant circuit operating in isolation, a second resonance region 260 from the second resonant circuit operating in isolation, and an overlapping resonance region 270 from the first and second resonant circuits operating simultaneously. A resonance region, as used herein, is to convey a field or fields produced by the associated resonating structures in isolation or in combination.

As shown, in the combined resonance region 270 (i.e., when the resonant structure 200 is operating simultaneously at multiple resonances), the plasma generation in the overlapping region 272 has contributions from both the first and second resonant circuits. In contrast, the non-overlapping region 274 is the product of the first resonant circuit only. Thus, modifying the various adjustable parameters of the resonating structure 200 or adjusting a power ratio between the resonant frequencies allows control of the center-to-edge density profile of the plasma generated by the resonating structure 200.

Figure 3A:
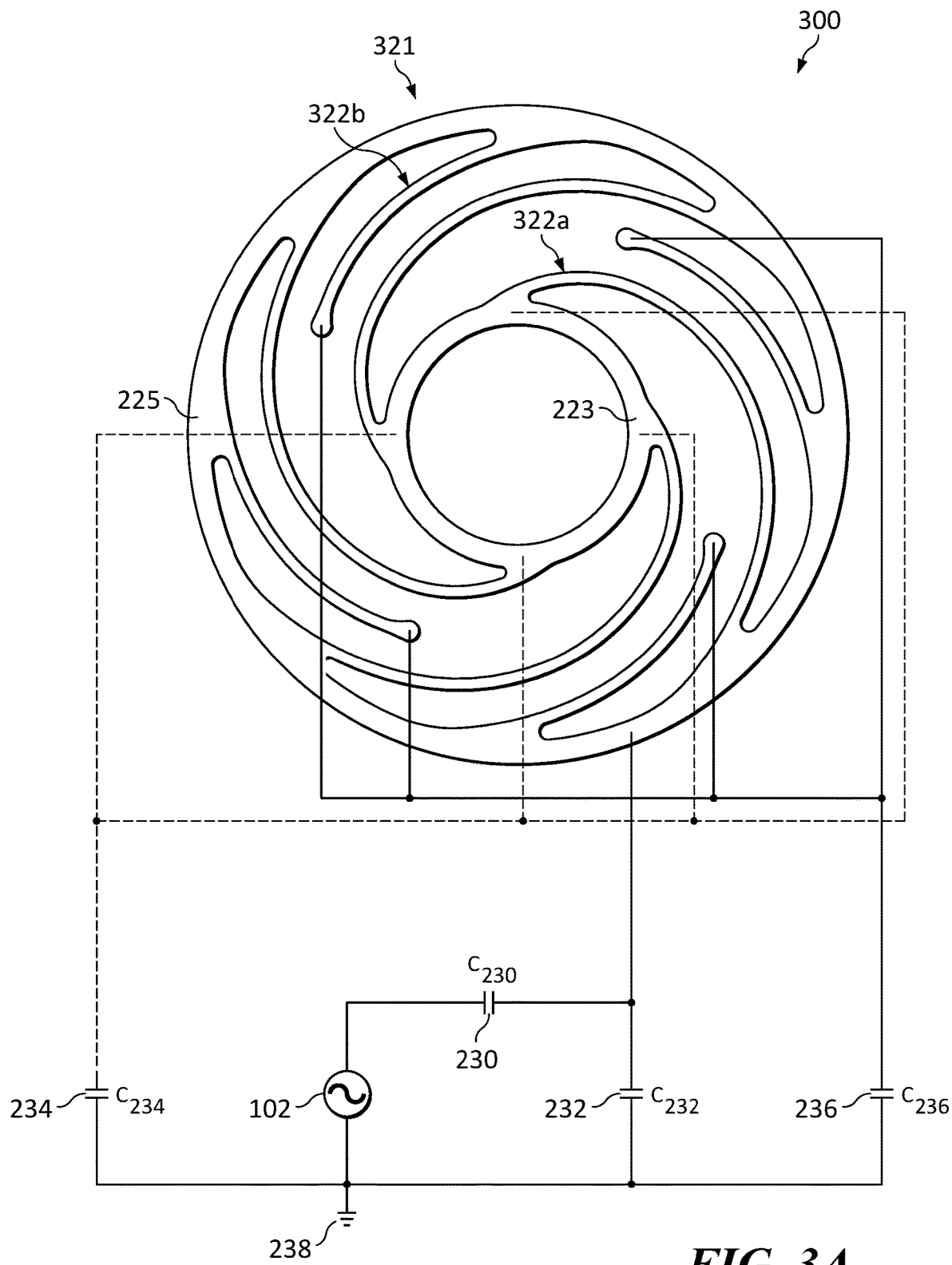
FIG. 3A is a hybrid schematic/drawing of an embodiment resonating structure.

FIG. 3A illustrates a hybrid schematic/drawing of an embodiment resonating structure 300. Resonating structure 300 may operate as the resonating structure 104 in the plasma processing system 100 in FIG. 1. It is noted that the resonating structure 300 is not limited to an application in plasma processing, and other applications are contemplated.

Resonating structure 300 shares several features with resonating structure 200. The resonating structure 300 includes a radiating structure 321, which is shown as a unibody, conductive, planar, and ring-shaped structure. The radiating structure 321 includes an inner ring 223, an outer ring 225, a set of first arms 322a, and a set of second arms 322b. Each arm of each set of arms 322a-b has an n-fold symmetry about an axis, which passes through the center point of the radiating structure 321.

In resonating structure 200, similar to resonating structure 300, the RF forward wave can be capacitively coupled from the RF source 102 through either the inner ring 223 or the outer ring 225.

Each first arm 322a is connected at one end to the inner ring 223 and connected at the other end to the outer ring 225. The outer ring 225 is coupled to a first terminal of the first capacitor 230 and the first terminal of the second capacitor 232. The second terminal of the first capacitor 230 is coupled to the RF source 102. The second terminal of the second capacitor 232 is coupled to RF ground 238. The inner ring 223 is coupled to the first terminal of a third capacitor 234. The second terminal of the third capacitor 234 is coupled to RF ground 238.

Each second arm 322b is connected at one end to the outer ring 225. The other end of each second arm 322b is coupled to the first terminal of a fourth capacitor 236. The second terminal of the fourth capacitor 236 is coupled to the RF ground 238.

The second capacitor 232, the third capacitor 234, and each first arm 322a form a respective first resonant circuit (i.e., LC resonant circuit). The second capacitor 232, the fourth capacitor 236, and each second arm 322b form a respective second resonant circuit (i.e., LC resonant circuit).

Figure 3B:
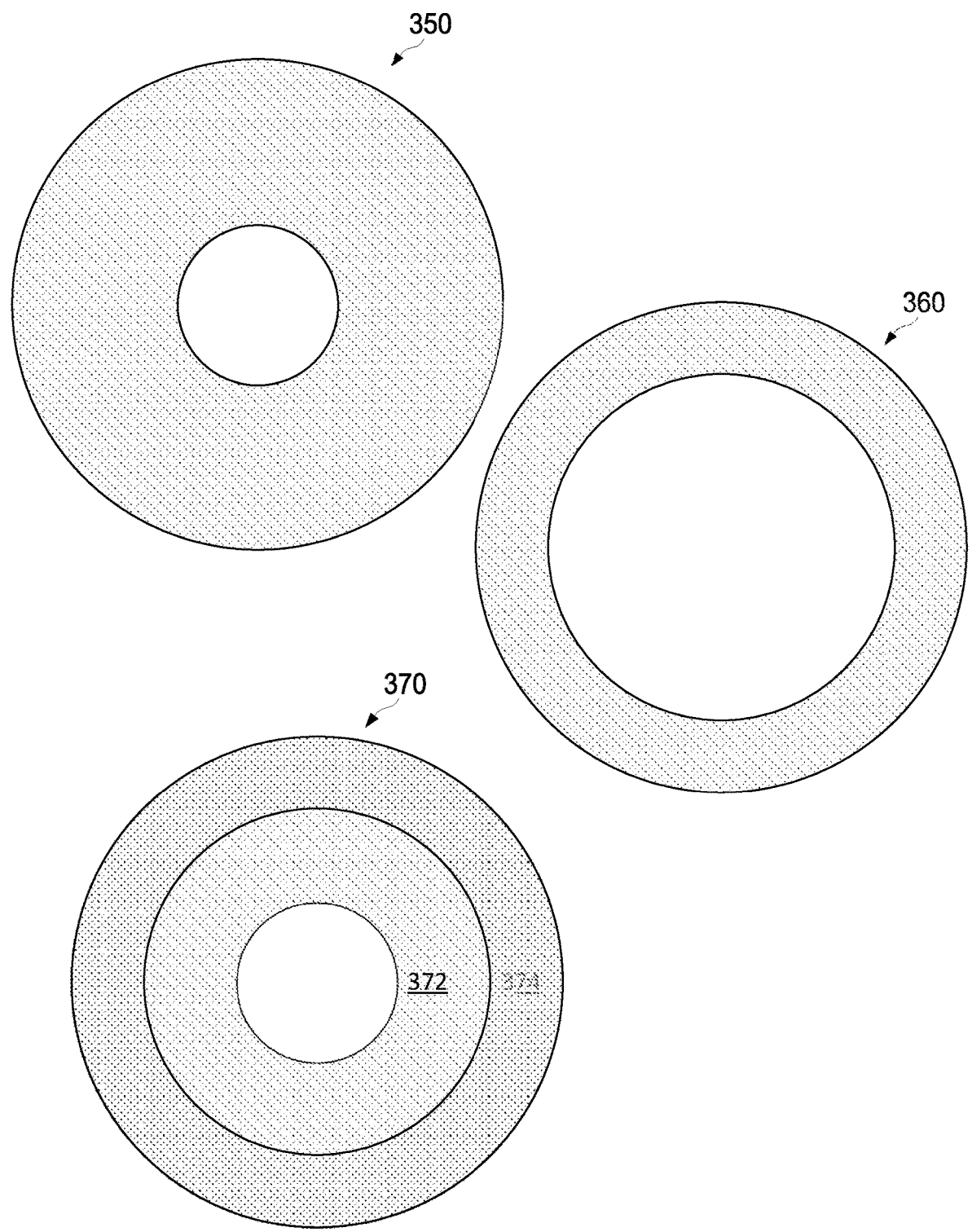
FIG. 3B is an illustration of resonance regions corresponding to one or more modes of the embodiment resonating structure of FIG. 3A.

FIG. 3B illustrates a first resonance region 350 from the first resonant circuit operating in isolation, a second resonance region 360 from the second resonant circuit operating in isolation, and an overlapping resonance region 370 from the first and second resonant circuits operating simultaneously.

As shown, in the overlapping resonance region 370 (i.e., when the resonant structure 300 is operating simultaneously at multiple resonances), the overlapping region 374 is the product of both the first and second resonant circuits. In contrast, the non-overlapping region 372 is the product of the first resonant circuit only. Thus, operating the first and second resonant circuits of the resonating structure 300 at different frequencies allows control of the edge-to-center density profile of the plasma generated by the resonating structure 300.

Figure 4:
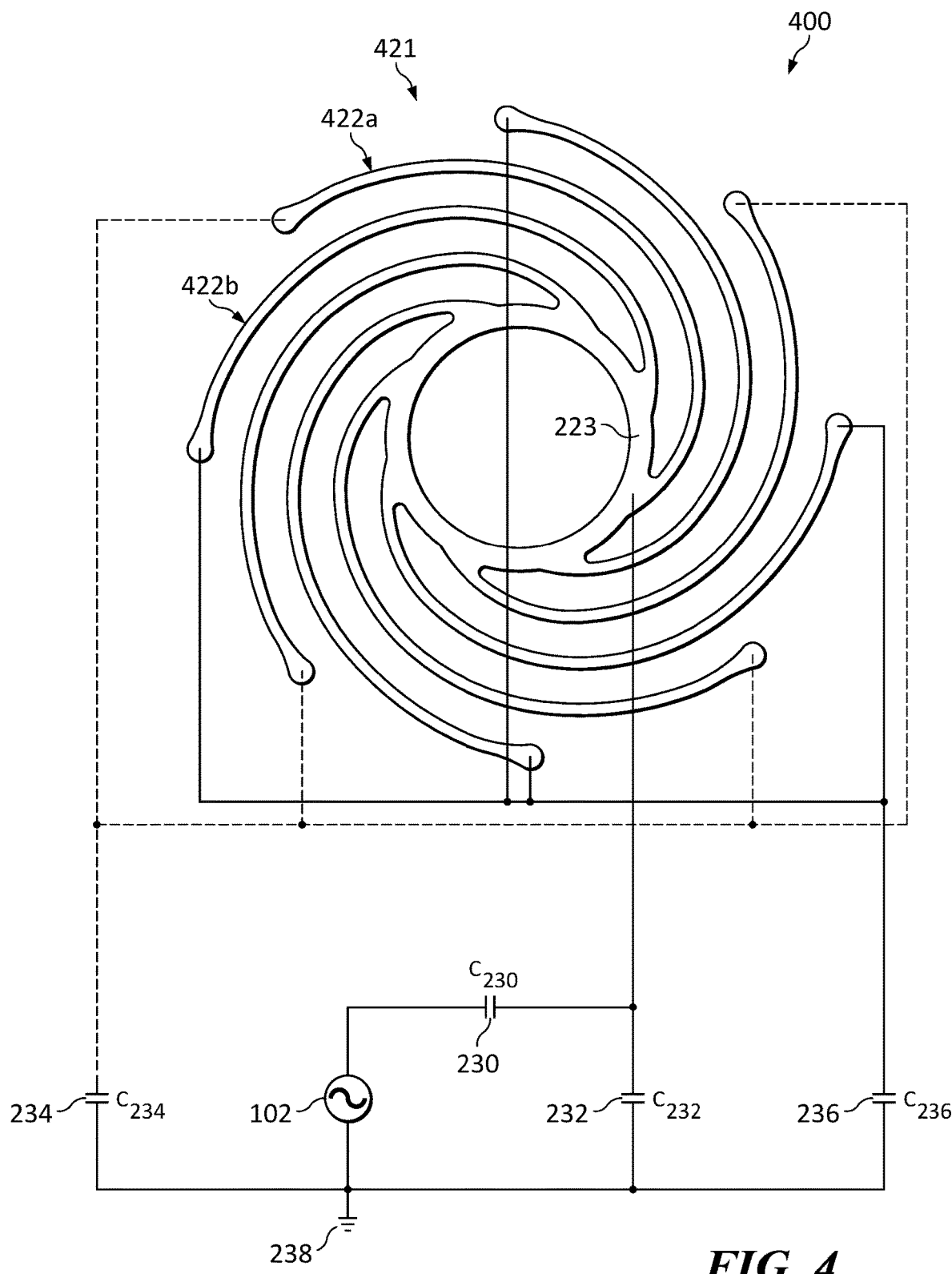
FIG. 4 is a hybrid schematic/drawing of an embodiment resonating structure.

FIG. 4 illustrates a hybrid schematic/drawing of an embodiment resonating structure 400. Resonating structure 400 may operate as the resonating structure 104 in the plasma processing system 100 in FIG. 1. It is noted that the resonating structure 400 is not limited to an application in plasma processing, and other applications are contemplated.

Resonating structure 400 shares several features with resonating structure 200. The resonating structure 400 includes a radiating structure 421, which is shown as a unibody, conductive, planar, and ring-shaped structure. The radiating structure 421 includes an inner ring 223, a set of first arms 422a, and a set of second arms 422b. Each arm of each set of arms 422a-b has an n-fold symmetry about an axis, which passes through the center point of the radiating structure 421.

Each first arm 422a is connected at one end to the inner ring 223 and connected at the other end to the first terminal of the third capacitor 234. The inner ring 223 is coupled to the first terminal of the first capacitor 230 and the first terminal of the second capacitor 232. The second terminal of the first capacitor 230 is coupled to the RF source 102. The second terminal of the second capacitor 232 is coupled to RF ground 238. The second terminal of the third capacitor 234 is coupled to RF ground 238.

Each second arm 422b is connected at one end to the inner ring 223. The other end of each second arm 422b is coupled to the first terminal of the fourth capacitor 236. The second terminal of the fourth capacitor 236 is coupled to the RF ground 238. As shown, the physical dimensions of the arms of the set of first arms 422a are identical to the physical dimensions of the arms of the set of second arms 422b. Thus, the inductance of each arm is the same for the set of first arms 422a and the set of second arms 422b.

The second capacitor 232, the third capacitor 234, and each first arm 422a form a respective first resonant circuit (i.e., LC resonant circuit). The second capacitor 232, the fourth capacitor 236, and each second arm 422b form a respective second resonant circuit (i.e., LC resonant circuit).

Figure 5A:
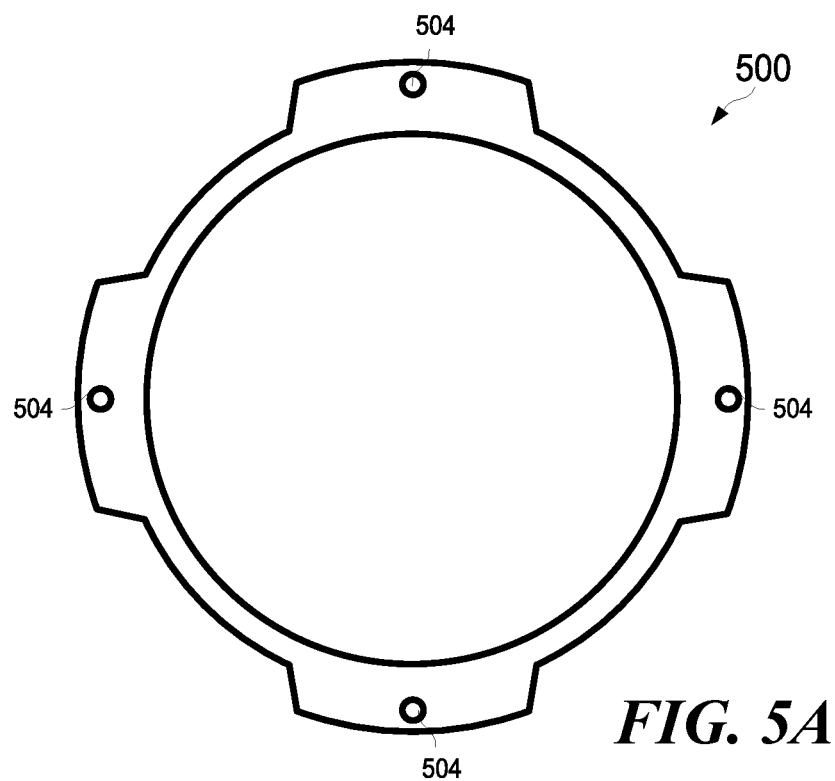
FIG. 5A is a drawing of an embodiment first conductive plate of a capacitive outer ring of a resonating structure.
Figure 5B:
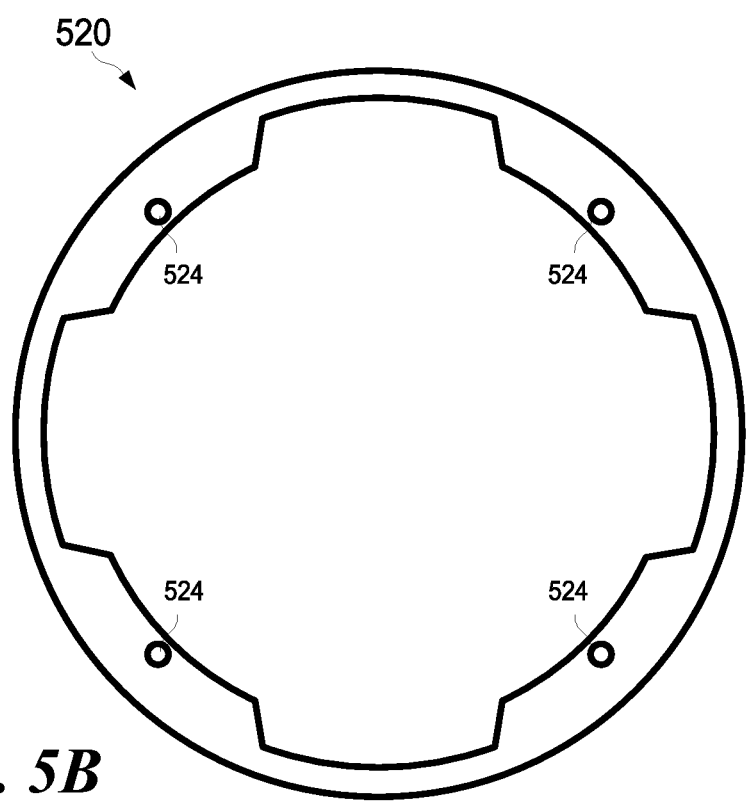
FIG. 5B is a drawing of an embodiment second conductive plate of a capacitive outer ring of a resonating structure.

FIG. 5A illustrates an embodiment of a first conductive plate 500 of a capacitive outer ring 212a—in reference to FIGS. 2B-C—to which the first arms 422a are coupled. FIG. 5B illustrates an embodiment of a second conductive plate 520 of the capacitive outer ring 212b—in reference to FIGS. 2B-C—to which the second arms 422b are coupled.

In embodiments, each first arm 422a is coupled to the first conductive plate 500 of the outer ring 212a via conductive offsets 224c at connection point 504. In embodiments, each second arm 422b is coupled to the second conductive plate 520 of the outer ring 212b via conductive offsets 224d at connection point 524.

The first conductive plate 500 is positioned within the inner ring cutout of the second conductive plate 520 without overlapping regions (i.e., electrically isolated from each other). Thus, in combination, the first conductive plate 500 and the second conductive plate 520 shown in FIGS. 5A-B form the outer ring 212a-b. The capacitance of the third capacitor 234 in the first resonant circuit depends on the material and dimensional parameters of the first conductive plate 500. Similarly, the capacitance of the fourth capacitor 236 in the second resonant circuit depends on the material and dimensional parameters of the second conductive plate 520.

In embodiments, the first conductive plate 500 is on the same plane as the second conductive plate 520 with respect to a vertical arrangement of the resonating structure 400, while in other embodiments, the plates may be arranged on different planes but parallel to each other.

It is noted that one factor governing the capacitance of each of the third capacitor 234 and the fourth capacitor 236 is, respectively, the dielectric parameters of the insulating structure 214 between the first conductive plate 500 and the housing bottom side 226b and the insulating structure 214 between the second conductive plate 520 and the housing bottom side 226b. As further detailed below, in embodiments, the insulating structure 214 may be different for each of these capacitors.

It should be appreciated that although the first conductive plate 500 and second conductive plate 520 are dimensioned for two sets of arms, each having four arms, additional capacitive or conductive plates that can connect to a different number of arms are similarly contemplated.

In embodiments, the various conductive plates allow shorter antenna segments and axisymmetry.

Figure 5C:
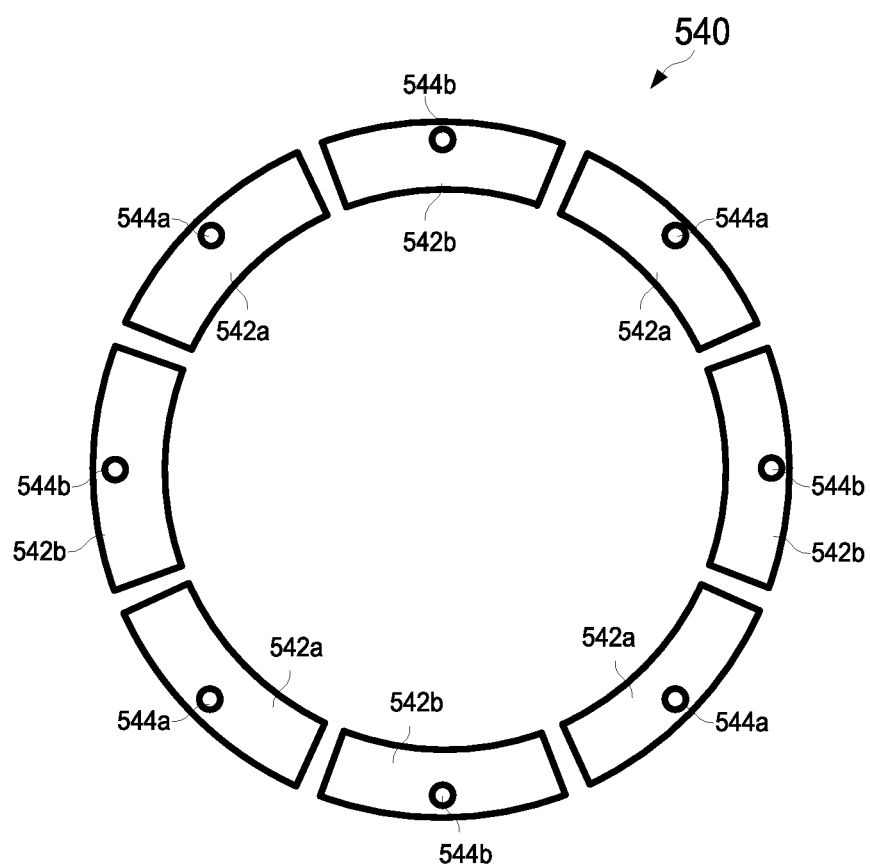
FIG. 5C is a drawing of an embodiment segmented outer ring of a capacitive outer of a resonating structure.

FIG. 5C illustrates an embodiment of a segmented outer ring 54o, which may represent, for example, the capacitive outer ring 212a-b in FIGS. 2B-C. The segmented outer ring 540 shows two sets of first segments 542a and second segments 542b, each having four segments. Each first arm 422a is coupled to a respective first segment 542a via conductive offsets 224c. Each second arm is coupled to a respective second segment 542b via conductive offsets 224d.

In embodiments, each segment in each set of first segments 542a and second segments 542b may have a different dimension or be of a different material. In some embodiments, each of the segments 542a has the same dimension and is of the same material. In some embodiments, each of the segments 542b has the same dimension and the same material. In some embodiments, each of the segments 542a-b has the same dimension and the same material.

In embodiments, one or more segments are coupled to one or more segments 542a-b via capacitors to create shared capacitors. In such embodiments, the shared capacitors may be within the first resonant circuit, the second resonant circuit, or both the first and second resonant circuits.

Figure 6A:
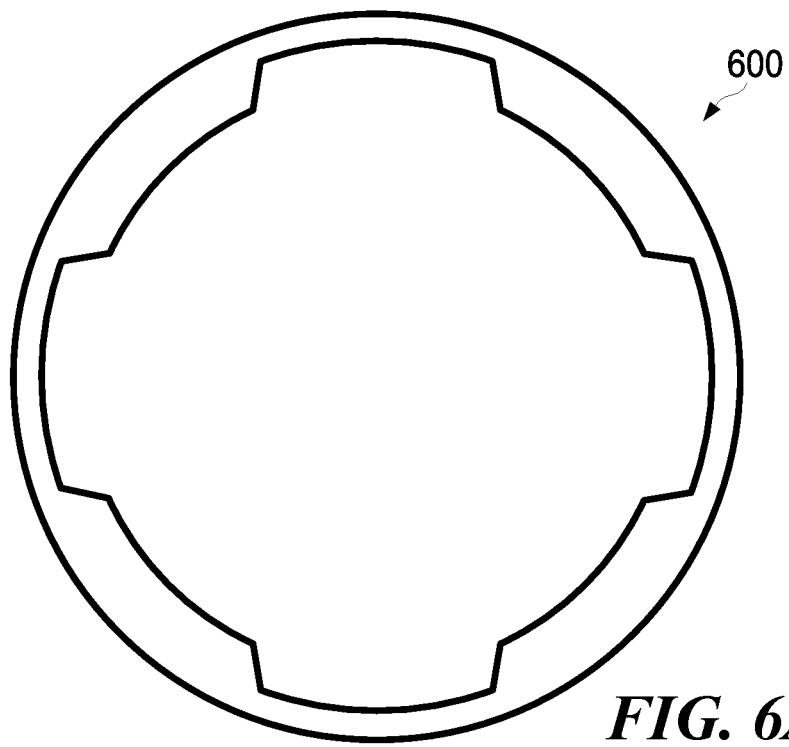
FIG. 6A is a drawing of an embodiment first dielectric plate of an insulating structure of a resonating structure.
Figure 6B:
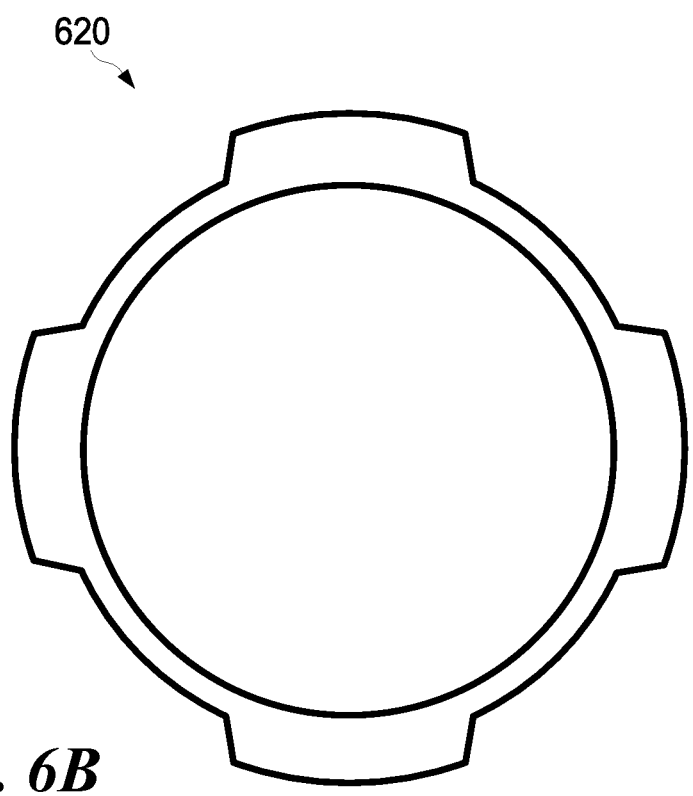
FIG. 6B is a drawing of an embodiment second dielectric plate of an insulating structure of a resonating structure.

FIG. 6A illustrates an embodiment of a first dielectric plate 600 of the insulating structure 214—in reference to FIGS. 2B-C. FIG. 6B illustrates an embodiment of a second dielectric plate 620 of the insulating structure 214—in reference to FIGS. 2B-C.

In embodiments, the first dielectric plate 600 is positioned within the inner ring cutout of the second dielectric plate 620 without overlapping regions. In other embodiments, the first dielectric plate 600 is positioned within the inner ring cutout of the second dielectric plate 620 with overlapping regions.

In combination, the first dielectric plate 600 and the second dielectric plate 620 shown, respectively, in FIGS. 6A-B form part of the insulating structure 214. In embodiments, the first dielectric plate 600 is on the same plane as the second dielectric plate 620 with respect to a vertical arrangement of the resonating structure 400, while in other embodiments, the plates may be arranged on different planes but parallel to each other.

In embodiments, the first conductive plate 500 and the second conductive plate 520 are positioned vertically above the first dielectric plate 600 and the second dielectric plate 62o. In such embodiments, the housing bottom side 226b is positioned vertically below the first dielectric plate 600 and the second dielectric plate 62o. The third capacitor 234 is formed by the first conductive plate 500, the first dielectric plate 600, and the housing bottom side 226b. The fourth capacitor is formed by the second conductive plate 52o, the second dielectric plate 62o, and the housing bottom side 226b.

In embodiments, the segmented outer ring 540 is positioned vertically above the first dielectric plate 600 and the second dielectric plate 62o. In such embodiments, the housing bottom side 226b is positioned vertically below the first dielectric plate 600 and the second dielectric plate 620.

Each respective third capacitor 234 of a first resonant circuit is formed by a first segment 542a, the first dielectric plate 600, and the housing bottom side 226b. Each respective fourth capacitor 236 of a second resonant circuit is formed by a second segment 542b, the second dielectric plate 62o, and the housing bottom side 226b.

Figure 6C:
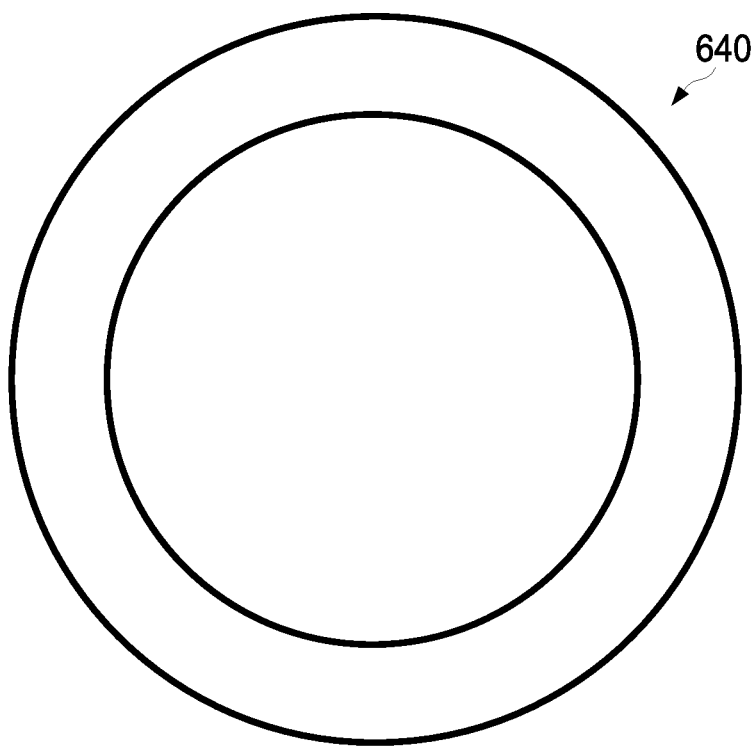
FIG. 6C is a drawing of an embodiment shared dielectric plate of an insulating structure of a resonating structure.

FIG. 6C illustrates an embodiment of a shared dielectric plate 640 as represented by the insulating structure 214 in reference to FIGS. 2B-C. In such an embodiment, the same insulating structure 214 is shared between the third capacitor 234 and the fourth capacitor 236.

In an embodiment, where the resonating structure 400 is used in combination with the shared dielectric plate 64o, the selection of the materials and dimensions of the first conductive plate 500 and the second conductive plate 520 or the material and dimensions (or connectivity between the segments) of the segmented outer ring 540 controls the resonant frequencies of the first resonant circuit and the second resonant circuit.

In embodiments, the insulating structure 214 between each segment and the housing bottom side 226b is equal in value. In some embodiments, the insulating structure 214 between each segment and the housing bottom side 226b is of a different value. In other embodiments, the insulating structure 214 of the first segments 542a is equal in value and the insulating structure 214 of the second segments 542b is equal in value, but different in value from the insulating structure 214 associated with the first segments 542a.

In embodiments, not only is the capacitance of the third capacitor 234 and the fourth capacitor 236 different, but the capacitance of each third capacitor 234 and fourth capacitor of each previously designated resonant circuit is different in value.

Thus, it should be appreciated that each of the third capacitor 234 and the fourth capacitor 236 can be adjusted or controlled by varying each segment, varying the underlying dielectric, or a combination thereof.

As disclosed herein, various dielectric and conductive plate combinations provide for different resonating structures that can operate as a single or a parallel resonance antenna. Thus, the embodiments explicitly disclosed herein are non-limiting. For brevity, it should be appreciated that other combinations based on the disclosure material may also be contemplated that provide for advantageous single or parallel resonance operations in a single resonating structure.

It should be noted that while the embodiments described utilize the structures described in FIGS. 5 and 6 for outer capacitor ring 212a-b, those structures can also apply to inner capacitor ring 210a-b.

For example, although each of the arms in the radiating structure 421 of FIG. 4 is shown to have been coupled to an inner ring 223 at one end and coupled to the capacitive outer ring 212a-b via the conductive offsets 224b at the other end, a radiating structure where each arm is coupled to an outer ring 225 at one end and coupled to the inner ring 210a-b 210a-b via the conductive offsets 224a with equal length arms throughout are also contemplated.

As another example, an embodiment where the radiating structure has arms of equal length and each arm is coupled at one end to an outer ring of the radiating structure and coupled on the other end to an inner ring of the radiating structure is also contemplated.

As yet another example, an embodiment where the radiating structure does not have an inner ring 223 or an outer ring 225 but has arms of equal length, and each arm is coupled at one end to the outer capacitive ring of the radiating structure via conductive offsets 224c-d and coupled at the other end to the inner capacitive ring via conductive offsets 224a-b is also contemplated.

As to each, the radiating structure can be used in combination with any of the (i) first conductive plate 500 and second conductive plate 520 or (ii) segmented outer ring 540 and one of (i) first dielectric plate 600 and second dielectric plate 620 or (ii) the shared dielectric plate 640 is contemplated to control the capacitance values of the third capacitor 234 or the fourth capacitor 236.

It should be appreciated that embodiments with an inner ring 210a-b 210a-b that has the form as described with the conductive plate 500 and second conductive plate 520 or the segmented outer ring 540 may also be contemplated. In such embodiments, the general shape and structure of the conductive plate is preserved but the dimensions are reduced to account for the smaller dimension of the inner ring 210a-b. Similarly, the dielectric material between these conductive plates for the inner ring 210a-b 210a-b and the housing bottom side 226b may have the same general shape and structure as the first dielectric plate 600 and the second dielectric plate 620 or the shared dielectric plate 64o. In these embodiments, the second capacitor 232 for each resonant circuit may have the same or different capacitance value based on the combination of the conductive plate or the dielectric plate used to form the resonant structure. Further, any combination of the outer ring 212a-b and the inner ring 210a-b based on the above conductive plates and dielectric plates and any of the resonating structures detailed above to form a resonating structure may be contemplated. Finally, any combination without the outer ring 225 and the inner ring 223 is similarly contemplated. In such an example, the arms are coupled to the interface structure 206 via conductive offsets 224a-d.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure. It should be appreciated that the physical arrangement and disposition of the components in the various embodiments of, for example, the plasma processing system or the resonating structures are non-limiting. For example, although the resonating structure is arranged between the RF source and the plasma processing system in the various illustrations, this arrangement is non-limiting, and these components may be arranged adjacent, above, or below the other components while within the scope of the present disclosure.

What is claimed is:

1. A radiating structure of a resonating structure used for plasma processing, the radiating structure comprising:
    a set of first arms, each first arm having a first inductance and coupled to a respective first capacitor and a respective second capacitor of the resonating structure to form a corresponding first resonant circuit operating at a first resonance frequency; and
    a set of second arms, each second arm having a second inductance and coupled to a respective third capacitor and a respective fourth capacitor of the resonating structure to form a corresponding second resonant circuit operating at a second resonance frequency, wherein in a first mode of operation, the resonating structure operates as a single resonance antenna, and wherein in a second mode of operation, the resonating structure operates as a parallel resonance antenna.

2. The radiating structure of claim 1, wherein each first arm has a same first length, and each second arm has a same second length different than the first length.

3. The radiating structure of claim 1, wherein each first arm and second arm is a spiral.

4. The radiating structure of claim 3, wherein each first arm and each second arm is an Archimedean, logarithmic, Fibonacci, involute of circle, or straight-line spiral.

5. The radiating structure of claim 1, wherein the radiating structure further comprises an inner ring and an outer ring, a diameter of the inner ring being less than a diameter of the outer ring, the inner ring and the outer ring having a same center point, each first arm and each second arm having a first end point coupled to the inner ring, each first arm having a second end point coupled to the outer ring, and each second arm having a second end point mechanically disconnected from the outer ring.

6. The radiating structure of claim 5, wherein the respective first capacitor and the respective third capacitor are a same capacitor coupled to the inner ring via a first conductive offset, wherein the respective second capacitor is coupled to the outer ring via a second conductive offset, and wherein the respective fourth capacitor is coupled to the second end point of each second arm via a third conductive offset.

7. The radiating structure of claim 1, wherein the radiating structure further comprises an inner ring and an outer ring, a diameter of the inner ring being less than a diameter of the outer ring, the inner ring and the outer ring having a same center point, each first arm and each second arm having a first end point coupled to the outer ring, each first arm having a second end point coupled to the inner ring, and each second arm having a second end point mechanically disconnected from the inner ring.

8. The radiating structure of claim 7, wherein the respective first capacitor and the respective third capacitor are a same capacitor coupled to the outer ring via a first conductive offset, wherein the respective second capacitor is coupled to the inner ring via a second conductive offset, and wherein the respective fourth capacitor is coupled to the second end point of each second arm via a third conductive offset.

9. The radiating structure of claim 1, wherein each first arm and each second arm has a same length, the respective first capacitor is coupled to a first end of each first arm via a first conductive offset, the respective second capacitor is coupled to a second end of each first arm via a second conductive offset, the respective third capacitor is coupled to a first end of each second arm via a third conductive offset, and the respective fourth capacitor is coupled to a second end of each second arm via a fourth conductive offset.

10. The radiating structure of claim 1, wherein each respective first capacitor is coupled to every other respective first capacitor, wherein each respective second capacitor is coupled to every other respective second capacitor, wherein each respective third capacitor is coupled to every other respective third capacitor, and wherein each respective fourth capacitor is coupled to every other respective fourth capacitor.

11. The radiating structure of claim 1, wherein the radiating structure further comprises an inner ring and an outer ring, a diameter of the inner ring being less than a diameter of the outer ring, the inner ring and the outer ring having a same center point, each first arm and each second arm having a first end point coupled to the inner ring, each first arm and each second arm having a second end point coupled to the outer ring.

12. The radiating structure of claim 1, wherein in the second mode of operation, a density profile of a plasma generated by the resonating structure is radially controlled by adjusting RF waveforms corresponding to each resonant circuit.

13. A radiating structure of a resonating structure used for plasma processing, the radiating structure comprising:
    a set of first arms coupled to a first capacitive plate of the resonating structure at a first end and a second capacitive plate of the resonating structure at a second end to form a set of first resonant circuits operating at a first resonance frequency; and
    a set of second arms coupled to the first capacitive plate of the resonating structure at a first end and to a third capacitive plate of the resonating structure at a second end to form a set of second resonant circuits operating at a second resonance frequency, wherein in a first mode of operation, the resonating structure operates as a single resonance antenna, and wherein in a second mode of operation, the resonating structure operates as a parallel resonance antenna.

14. The radiating structure of claim 13, wherein in the second mode of operation, a density profile of a plasma generated by the resonating structure is radially controlled by adjusting RF waveforms corresponding with the first resonance frequency and the second resonance frequency.

15. The radiating structure of claim 13, wherein the first capacitive plate is formed by a first conductive plate, a first dielectric, and a bottom side of a housing of the resonating structure, wherein the second capacitive plate is formed by a second conductive plate, a second dielectric, and the bottom side of the housing of the resonating structure, and wherein the third capacitive plate is formed by a third conductive plate, a third dielectric, and the bottom side of the resonating structure.

16. The radiating structure of claim 13, wherein the set of first arms and the set of second arms are arranged in a repeating radial pattern.

17. The radiating structure of claim 13, wherein each first arm has a same first length, and each second arm has a same second length different than the first length.

18. A resonating structure for plasma processing, the resonating structure comprising:
    a first capacitive plate, a second capacitive plate, a third capacitive plate, and a fourth capacitive plate;
    a set of first arms coupled to the first capacitive plate at a first end and to the second capacitive plate at a second end to form a set of first resonant circuits operating at a first resonance frequency; and
    a set of second arms coupled to the third capacitive plate at a first end and to the fourth capacitive plate at a second end to form a set of second resonant circuits operating at a second resonance frequency, wherein in a first mode of operation, the resonating structure operates as a single resonance antenna, and wherein in a second mode of operation, the resonating structure operates as a parallel resonance antenna.

19. The resonating structure of claim 18, wherein in the second mode of operation, a density profile of plasma generated by the resonating structure is radially controlled by adjusting RF waveforms corresponding with the first resonance frequency and the second resonance frequency.

20. The resonating structure of claim 18, wherein the first capacitive plate is formed by a first conductive plate, a first dielectric, and a bottom side of a housing of the resonating structure, wherein the second capacitive plate is formed by a second conductive plate, a second dielectric, and the bottom side of the housing of the resonating structure, wherein the third capacitive plate is formed by a third conductive plate, a third dielectric, and the bottom side of the resonating structure, and wherein the fourth capacitive plate is formed by a fourth conductive plate, a fourth dielectric, and the bottom side of the resonating structure.

21. The resonating structure of claim 18, wherein each first arm and each second arm is an Archimedean spiral, each first arm having a same first length, and each second arm having a same second length different than the first length.

22. The resonating structure of claim 18, wherein each first and second arm is an Archimedean spiral, and each first arm and each second arm having a same length.

* * * * *